(12) United States Patent
Lee et al.

(10) Patent No.: US 10,297,299 B2
(45) Date of Patent: May 21, 2019

(54) SEMICONDUCTOR DEVICE AND OPERATING METHOD THEREOF

(71) Applicant: SK hynix Inc., Icheon-si Gyeonggi-do (KR)

(72) Inventors: Jung Hwan Lee, Suwon-si (KR); Da U Ni Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/693,778

(22) Filed: Sep. 1, 2017

(65) Prior Publication Data

US 2018/0197587 A1 Jul. 12, 2018

(30) Foreign Application Priority Data

Jan. 11, 2017 (KR) .................. 10-2017-0004205

(51) Int. Cl.
| | | |
|---|---|---|
| *G11C 7/22* | (2006.01) | |
| *G11C 8/08* | (2006.01) | |
| *G11C 8/10* | (2006.01) | |
| *G11C 7/06* | (2006.01) | |
| *G11C 7/04* | (2006.01) | |
| *G11C 16/10* | (2006.01) | |
| *G11C 11/56* | (2006.01) | |
| *G11C 16/04* | (2006.01) | |
| *G11C 16/08* | (2006.01) | |
| *G11C 16/26* | (2006.01) | |
| *G11C 16/34* | (2006.01) | |
| *H01L 27/11556* | (2017.01) | |
| *H01L 27/11582* | (2017.01) | |

(52) U.S. Cl.
CPC .................. *G11C 8/08* (2013.01); *G11C 7/04* (2013.01); *G11C 7/06* (2013.01); *G11C 8/10* (2013.01); *G11C 11/5628* (2013.01); *G11C 11/5642* (2013.01); *G11C 16/0483* (2013.01); *G11C 16/08* (2013.01); *G11C 16/10* (2013.01); *G11C 16/26* (2013.01); *G11C 16/3418* (2013.01); *G11C 16/3459* (2013.01); *H01L 27/11556* (2013.01); *H01L 27/11582* (2013.01)

(58) Field of Classification Search
CPC .................................. G11C 7/22; G11C 5/147
USPC ............................................. 365/189.14, 226
See application file for complete search history.

(56) References Cited

U.S. PATENT DOCUMENTS 6,055,198 A * 4/2000 Tailliet ............. G01R 31/31719
365/195
6,205,056 B1 * 3/2001 Pan ..................... G11C 16/3454
365/185.2

(Continued)

FOREIGN PATENT DOCUMENTS

| KR | 1020040006384 A | 1/2004 |
|---|---|---|
| KR | 101080394 B1 | 11/2011 |
| KR | 1020120079371 A | 7/2012 |

*Primary Examiner* — Michael T Tran
(74) *Attorney, Agent, or Firm* — William Park & Associates Ltd.

(57) ABSTRACT

A semiconductor memory device may include a memory cell array. The semiconductor memory device may include a peripheral circuit coupled to the memory cell array through word lines. The semiconductor memory device may include an overdrive setting unit configured for determining an overdrive set parameter of an overdrive operation using an operation voltage applied to the word lines.

18 Claims, 19 Drawing Sheets

(56) References Cited

U.S. PATENT DOCUMENTS

| | | | | |
|---|---|---|---|---|
| 7,920,410 | B1* | 4/2011 | Lee | G11C 8/10 |
| | | | | 365/154 |
| 8,797,790 | B1* | 8/2014 | Rahim | G11C 5/06 |
| | | | | 365/156 |
| 9,508,397 | B1* | 11/2016 | Eguchi | G11C 16/10 |
| 2007/0013425 | A1* | 1/2007 | Burr | G11C 11/412 |
| | | | | 327/208 |
| 2008/0158983 | A1* | 7/2008 | Mokhlesi | G11C 16/3418 |
| | | | | 365/185.21 |
| 2008/0273388 | A1* | 11/2008 | Chin | G11C 11/5628 |
| | | | | 365/185.17 |
| 2009/0267046 | A1* | 10/2009 | Mazoyer | H01L 27/2436 |
| | | | | 257/3 |
| 2010/0128513 | A1* | 5/2010 | Nishimura | G11C 11/22 |
| | | | | 365/145 |
| 2013/0099692 | A1* | 4/2013 | Chaji | H05B 37/02 |
| | | | | 315/224 |
| 2016/0086675 | A1* | 3/2016 | Ray | G11C 16/26 |
| | | | | 365/185.12 |
| 2016/0164515 | A1* | 6/2016 | Goel | H03K 17/165 |
| | | | | 327/434 |
| 2016/0267981 | A1* | 9/2016 | Hioka | G11C 16/0483 |
| 2018/0012667 | A1* | 1/2018 | Costa | G11C 16/0483 |
| 2018/0033372 | A1* | 2/2018 | Kishi | G09G 3/20 |

\* cited by examiner

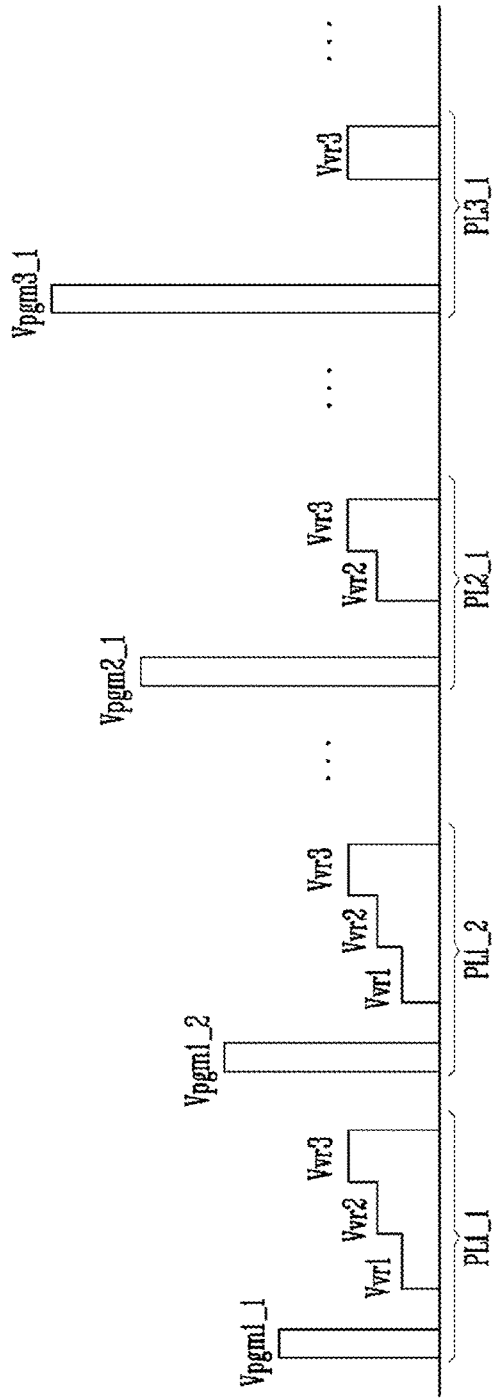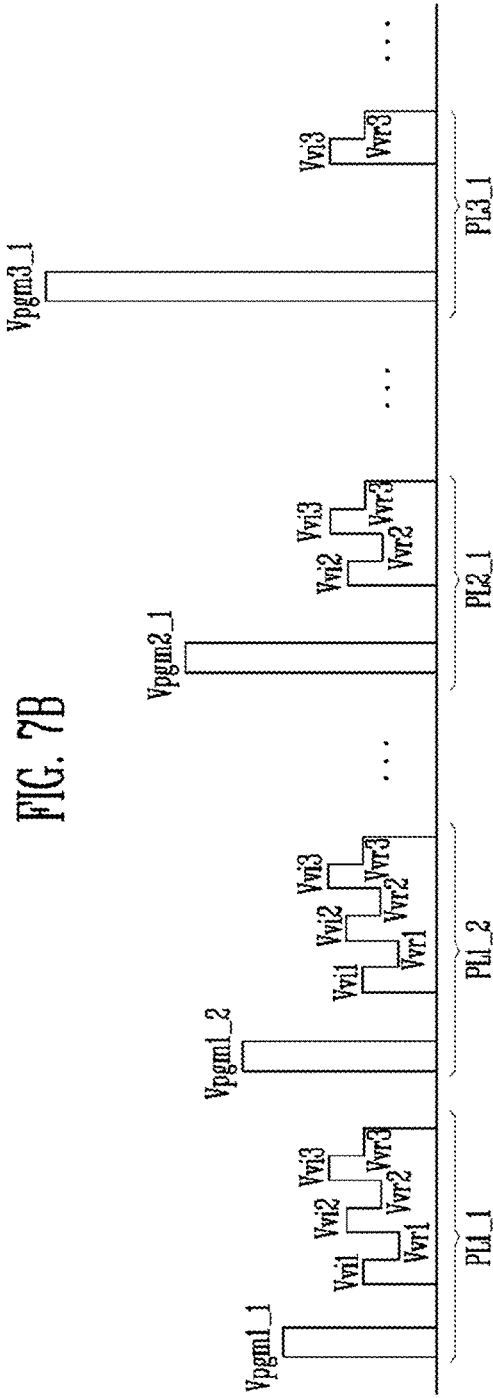

SEMICONDUCTOR DEVICE AND OPERATING METHOD THEREOF

CROSS-REFERENCE TO RELATED APPLICATION

The present application claims priority under 35 U.S.C. § 119(a) to Korean patent application number 10-2017-0004205 filed on Jan. 11, 2017, in the Korean Intellectual Property Office, the entire disclosure of which is incorporated by reference herein.

BACKGROUND

1. Technical Field

Various embodiments may generally relate to an electronic device, more particularly, to a semiconductor device and an operating method thereof.

2. Related Art

A semiconductor memory device is a memory device embodied by using semiconductors such as silicon (Si), germanium (Ge), gallium arsenide (GaAs), and indium phosphide (InP). Semiconductor memory devices are classified into volatile memory devices and non-volatile memory devices.

Volatile memory devices lose stored data when powered off. Examples of volatile memory devices include Static RAM (SRAM), Dynamic RAM (DRAM) and Synchronous DRAM (SDRAM). Non-volatile memory devices retain stored data regardless of power on/off conditions. Examples of non-volatile memory include Read Only Memory (ROM), Mask ROM (MROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM) and Ferroelectric RAM (FRAM). Flash memories are classified into NOR-type memories and NAND-type memories.

SUMMARY

A semiconductor memory device may be provided. The semiconductor memory device may include a memory cell array including a plurality of cell strings. The semiconductor memory device may include an address decoder coupled to the memory cell array through word lines and configured for decoding an address for an operation on the memory cell array. The semiconductor memory device may include a read and write circuit configured for performing a read operation or a program operation on the memory cell array. The semiconductor memory device may include a control logic configured for controlling the address decoder and the read and write circuit to perform the read operation or the program operation on the memory cell array. The semiconductor memory device may include an overdrive setting unit configured for determining an overdrive set parameter of an overdrive operation using an operation voltage applied to the word lines of the memory cell array. The control logic may control the overdrive operation using the operation voltage applied to the word lines on the basis of the overdrive set parameter.

A method of operating a semiconductor memory device may be provided. The method of operation the semiconductor memory device may include receiving an operation command for an operation of the semiconductor memory device. The method of operation the semiconductor memory device may include detecting a current temperature of the semiconductor memory device to generate temperature information. The method of operation the semiconductor memory device may include determining an overdrive set parameter of an operation voltage related to the operation command on the basis of the temperature information. The method of operation the semiconductor memory device may include applying an operation voltage having an overdrive voltage level greater than a target voltage level on the basis of the overdrive set parameter. The method of operation the semiconductor memory device may include applying the operation voltage having the target voltage level by reducing the overdrive voltage level.

A semiconductor memory device may be provided. The semiconductor memory device may include a memory cell array. The semiconductor memory device may include a peripheral circuit coupled to the memory cell array through word lines. The semiconductor memory device may include an overdrive setting unit configured for determining an overdrive set parameter of an overdrive operation using an operation voltage applied to the word lines. The peripheral circuit may control the overdrive operation using the operation voltage applied to the word lines on the basis of the overdrive set parameter.

BRIEF DESCRIPTION OF THE DRAWINGS

FIG. 7A is a timing diagram illustrating a program method of a general semiconductor memory device.

FIG. 7B is a timing diagram illustrating a program method of a semiconductor memory device using an overdrive voltage.

DETAILED DESCRIPTION

Figure 1:
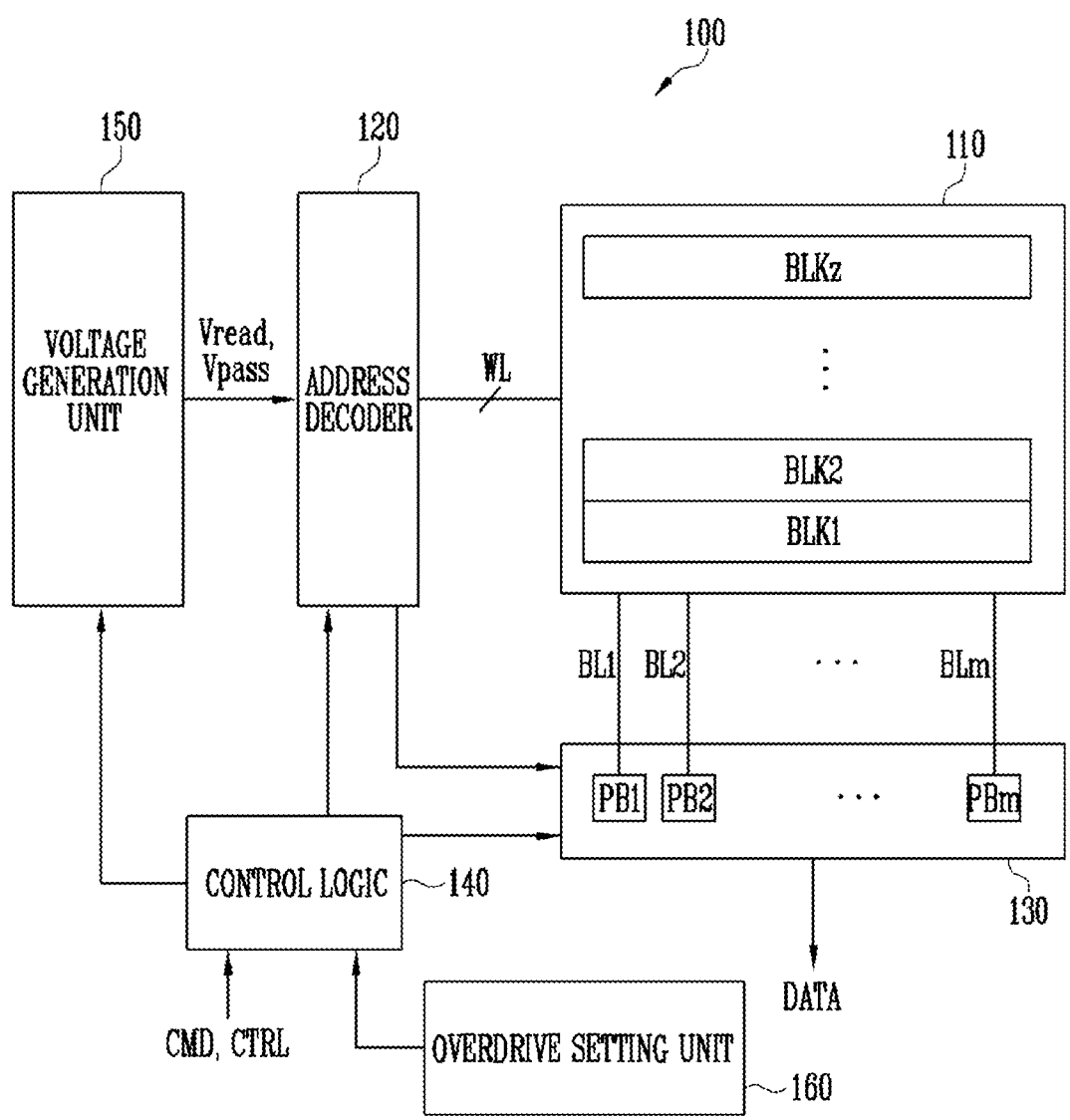
FIG. 1 is a block diagram illustrating a semiconductor memory device according to an embodiment.

Hereinafter, various examples of embodiments will be described with reference to the accompanying drawings. The figures are provided to allow those with ordinary skill in the art to understand the scope of the embodiments. The embodiments may, however, be embodied in different forms and should not be construed as limited to the embodiments set forth. Rather, these embodiments are provided so that this disclosure will be thorough and complete. In addition, the embodiments are provided to fully convey the scope of the disclosure to those skilled in the art.

It should be understood that, when it is described that an element is "coupled" or "connected" to another element, the element may be directly coupled or directly connected to the other element or coupled or connected to the other element through a third element. On the contrary, it should be understood that when an element is referred to as being "directly connected to" or "directly coupled to" another element, another element does not intervene therebetween.

In describing embodiments of the present disclosure, portions not relating to the present embodiment will be omitted so as not unnecessarily obscure the gist of the present disclosure. When designating reference numerals for components in the drawings, it may be intended that like reference numbers may refer to like components throughout the drawings.

Various embodiments may generally relate to a semiconductor memory device having improved operating characteristics.

Various embodiments may generally relate to a method of operating a semiconductor memory device having improved operating characteristics.

FIG. 1 is a block diagram of a semiconductor memory device 100 according to an embodiment. In an embodiment, for example, a semiconductor device may include a semiconductor memory device 100.

Referring to FIG. 1, the semiconductor memory device 100 may include a memory cell array 110, an address decoder 120, a read and write circuit 130, a control logic 140, a voltage generation unit 150 and an overdrive setting unit 160.

The memory cell array 110 may include a plurality of memory blocks BLK1 to BLKz. The plurality of memory blocks BLK1 to BLKz may be coupled to the address decoder 120 through word lines WL. The plurality of memory blocks BLK1 to BLKz may be coupled to the read and write circuit 130 through bit lines BL1 to BLm. Each of the plurality of memory blocks BLK1 to BLKz may include a plurality of memory cells. According to an embodiment, the plurality of memory cells may be non-volatile memory cells having a vertical channel structure. The memory cell array 110 may have a two-dimensional structure. According to an embodiment, the memory cell array 110 may have a three-dimensional structure. According to an embodiment, each of the plurality of memory blocks BLK1 to BLKz included in the memory cell array 110 may include a plurality of sub-blocks. For example, each of the plurality of memory blocks BLK1 to BLKz may include two sub-blocks. In an example, each of the plurality of memory blocks BLK1 to BLKz may include four sub-blocks. In a semiconductor memory device and an operating method thereof according to an embodiment, the number of sub-blocks included in each memory block is not limited thereto, and the number of sub-blocks included in each memory block may vary.

Each of the plurality of memory cells included in the memory cell array may store at least 1-bit data. According to an embodiment, each of the plurality of memory cells included in the memory cell array 110 may be a single-level cell (SLC) storing 1-bit data. According to an embodiment, each of the plurality of memory cells included in the memory cell array 110 may be a multi-level cell (MLC) storing 2-bit data. According to an embodiment, each of the plurality of memory cells included in the memory cell array 110 may be a triple-level cell (TLC) storing 3-bit data. According to an embodiment, each of the plurality of memory cells included in the memory cell array 110 may be a quad-level cell (QLC) storing 4-bit data. According to an embodiment, each of the plurality of memory cells included in the memory cell array 110 may store 5 or more bits of data.

The address decoder 120, the read and write circuit 130 and the control logic 140 may operate as a peripheral circuit driving the memory cell array 110. The address decoder 120 may be coupled to the memory cell array 110 through the word lines WL. The address decoder 120 may operate in response to control of the control logic 140. The address decoder 120 may receive an address through an input/output buffer (not illustrated) in the semiconductor memory device 100.

The address decoder 120 may be configured to decode a block address of the received address. The address decoder 120 may select at least one memory block according to the decoded block address. During a read operation, the address decoder 120 may apply a read voltage Vread generated by the voltage generation unit 150 to a selected word line of the selected memory block and a pass voltage Vpass to unselected word lines. During a program verify operation, a verify voltage generated by the voltage generation unit 150 may be applied to the selected word line of the selected memory block and the pass voltage Vpass may be applied to the unselected word lines.

The address decoder 120 may be configured to decode a column address of the received address. The address decoder 120 may transfer the decoded column address to the read and write circuit 130.

A read operation and a program operation of the semiconductor memory device 100 may be performed in units of pages. An address received at the request of a read operation and a program operation may include a block address, a row address and a column address. The address decoder 120 may select one memory block and one word line in response to the block address and the row address. The column address may be decoded by the address decoder 120 and provided to the read and write circuit 130.

The address decoder 120 may include a block decoder, a row decoder, a column decoder and an address buffer.

The read and write circuit 130 may include a plurality of page buffers PB1 to PBm. The read and write circuit 130 may operate as a read circuit during a read operation of the memory cell array 110 and a write circuit during a write operation thereon. The page buffers PB1 to PBm may be coupled to the memory cell array 110 through the bit lines BL1 to BLm. The page buffers PB1 to PBm may continuously supply a sensing current to bit lines coupled to memory cells in order to sense threshold voltages of memory cells and sense changes in amount of current caused by program states of memory cells corresponding thereto through a sensing node to latch sensing data during a read operation and a program verify operation. The read and write circuit 130 may operate in response to page buffer control signals output from the control logic 140.

The read and write circuit 130 may sense data of a memory cell, temporarily store read data, and output data DATA to an input/output buffer (not illustrated) of the semiconductor memory device 100 during a read operation. According to an example of an embodiment, the read and write circuit 130 may include a column selection circuit in addition to the page buffers (or page registers).

The control logic 140 may be coupled to the address decoder 120, the read and write circuit 130, and the voltage generation unit 150. The control logic 140 may receive a command CMD and a control signal CTRL through an input/output buffer (not illustrated) of the semiconductor memory device 100. The control logic 140 may be configured to control general operations of the semiconductor memory device 100 in response to the control signal CTRL. The control logic 140 may output a control signal to control sensing node precharge potential levels of the page buffers PB1 to PBm. The control logic 140 may control the read and write circuit 130 to perform a read operation of the memory cell array 110.

The voltage generation unit 150 may generate the read voltage Vread and the pass voltage Vpass in response to a voltage generation unit control signal output from the control logic 140 during a read operation.

The overdrive setting unit 160 may determine an overdrive set parameter on an overdrive operation using an operation voltage applied to the word lines WL of the memory cell array 110. The control logic 140 may control the overdrive operation of the operation voltage applied to the word lines WL on the basis of the overdrive set parameter.

According to an embodiment, the overdrive setting unit 160 of the semiconductor memory device 100 may determine an overdrive set parameter on the basis of the current temperature of the semiconductor memory device 100. Therefore, the overdrive operation of the semiconductor memory device 100 may be adaptively controlled according to temperature variations. According to an embodiment, the overdrive setting unit 160 of the semiconductor memory device 100 may determine an overdrive set parameter on the basis of program states of selected memory cells during a program operation. Therefore, the overdrive operation of the semiconductor memory device 100 may be adaptively controlled as a program loop is performed. Therefore, an operating speed of the semiconductor memory device 100 may be improved.

Figure 2:
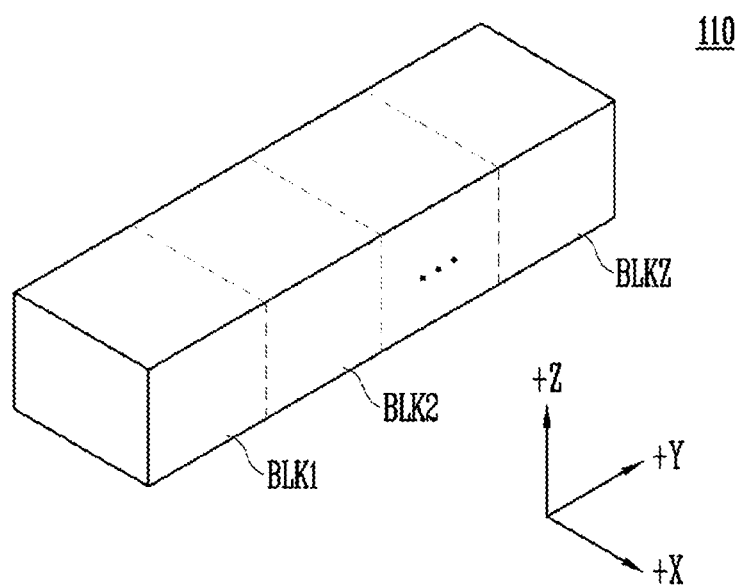
FIG. 2 is a block diagram illustrating an embodiment of a memory cell array illustrated in FIG. 1.

FIG. 2 is a block diagram illustrating an embodiment of the memory cell array 110 illustrated in FIG. 1.

Referring to FIG. 2, the memory cell array 110 may include a plurality of memory blocks BLK1 to BLKz. Each of the memory blocks may include a three-dimensional structure. Each memory block may include a plurality of memory cells stacked over a substrate. The plurality of memory cells may be arranged in +X direction, +Y direction and +Z direction. Each memory block having the above three-dimensional structure will be described with reference to FIGS. 3B and 3C. However, contrary to FIG. 2, each memory block of the memory cell array 110 may have a two-dimensional structure. The memory block having the two-dimensional structure will be described with reference to FIG. 3A.

Figure 3A:
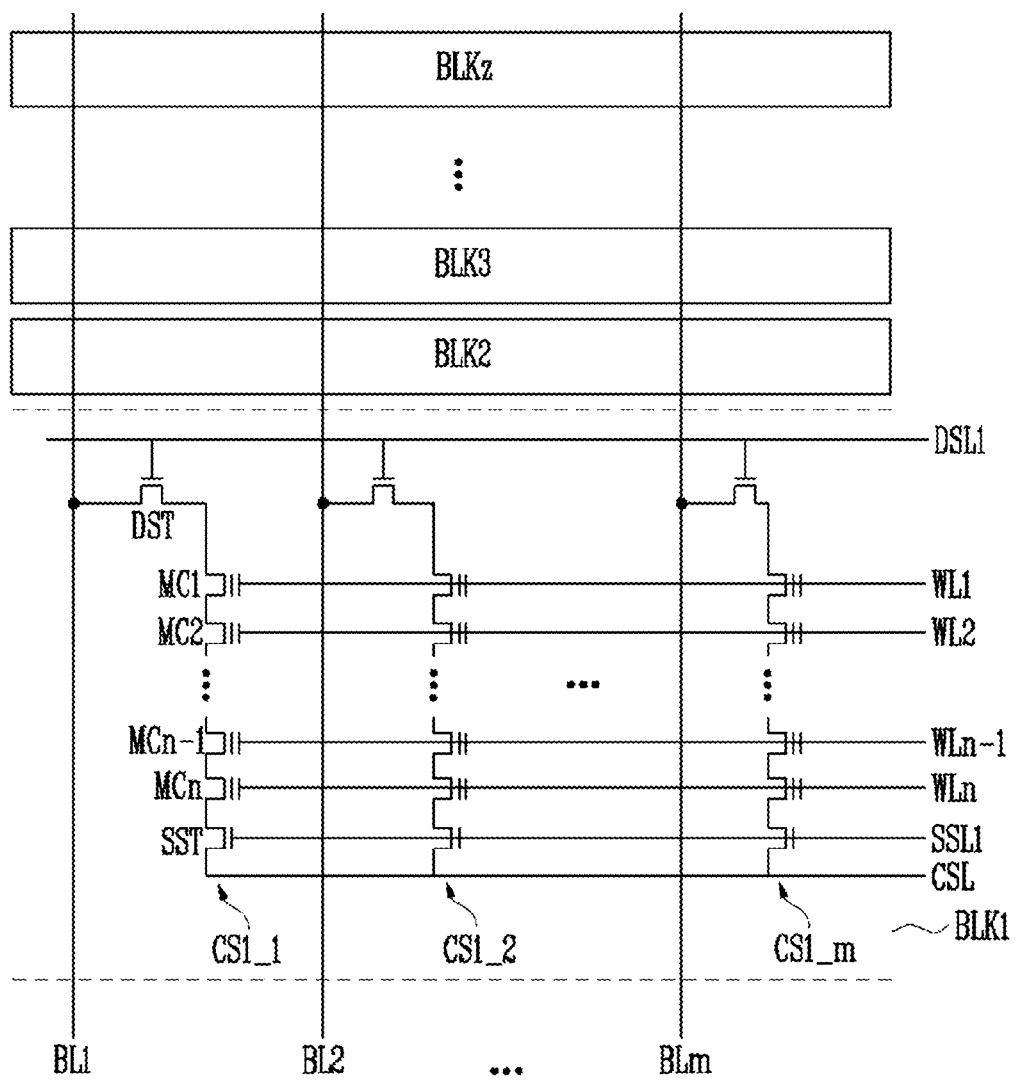
FIGS. 3A, 3B and 3C are diagrams illustrating other embodiments of a memory cell array illustrated in FIG. 1.
Figure 3B:
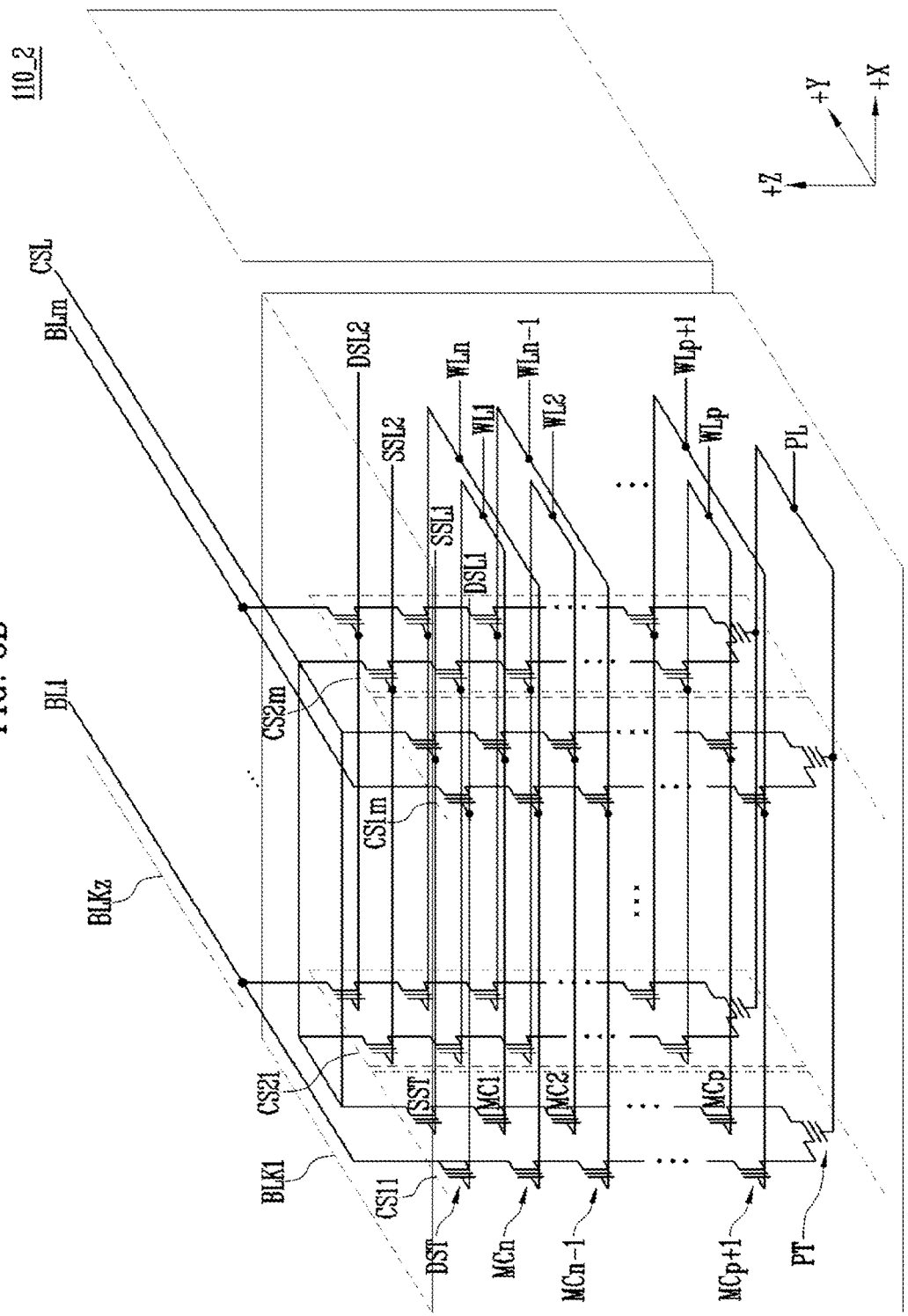
Figure 3C:
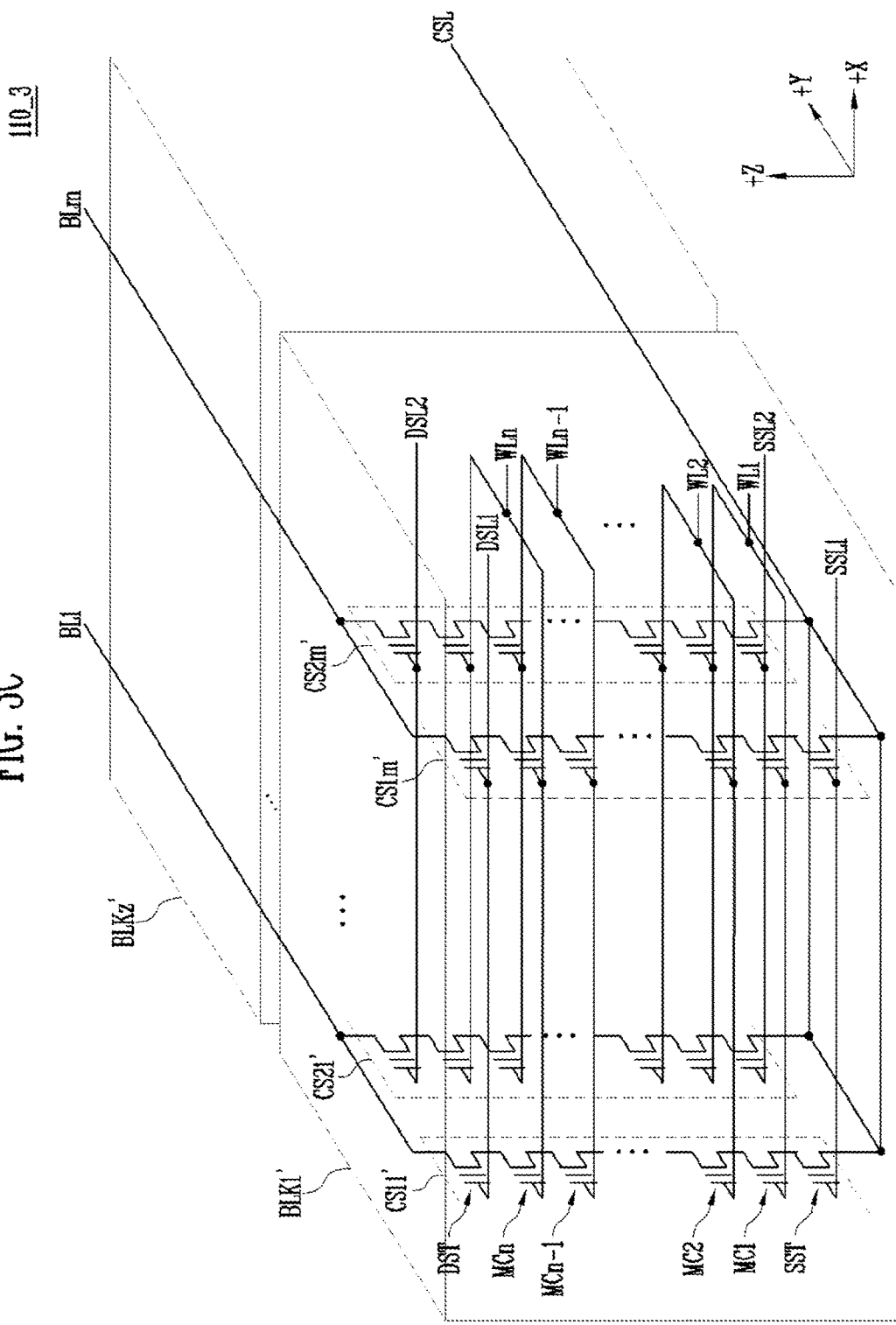

FIGS. 3A, 3B and 3C are diagrams illustrating other embodiments of the memory cell array 110 illustrated in FIG. 1.

Referring to FIG. 3A, first to zth memory blocks BLK1 to BLKz included in a memory cell array 110_1 may be commonly coupled to the first to mth bit lines BL1 to BLm. For convenience of explanation, components included in the first memory block BLK1, among the plurality of memory blocks BLK1 to BLKz, are illustrated in FIG. 3A, whereas components included in the memory blocks BLK2 to BLKz are omitted. Each of the memory blocks BLK2 to BLKz may be configured in the same manner as the first memory block BLK1.

The memory block BLK1 may include a plurality of cell strings CS1_1 to CS1_m. The first to mth cell strings CS1_1 to CS1_m may be coupled to the first to mth bit lines BL1 to BLm, respectively.

Each of the first to mth cell strings CS1_1 to CS1_m may include a drain selection transistor DST, a plurality of memory cells MC1 to MCn coupled in series, and a source selection transistor SST. The drain selection transistor DST may be coupled to a drain selection line DSL1. Each of the first to nth memory cells MC1 to MCn may be coupled to the first to nth word lines WL1 to WLn. The source selection transistor SST may be coupled to a source selection line SSL1. A drain side of the drain selection transistor DST may be coupled to a corresponding bit line. Drain selection transistors of the first to mth cell strings CS1_1 to CS1_m may be coupled to the first to mth bit lines BL1 to BLm, respectively. A source side of the source selection transistor SST may be coupled to a common source line CSL. According to an embodiment, the common source line CSL may be commonly coupled to the first to zth memory blocks BLK1 to BLKz.

The drain selection line DSL1, the first to nth word lines WL1 to WLn, and the source selection line SSL1 may be controlled by the address decoder 120. The common source line CSL may be controlled by the control logic 140. The first to mth bit lines BL1 to BLm may be controlled by the read and write circuit 130.

As illustrated in FIG. 3A, according to an embodiment, the memory cell array 110 of the semiconductor memory device 100 may include the memory cell array 110_1 having a two-dimensional structure. However, according to an embodiment, the memory cell array 110 of the semiconductor memory device 100 may have a three-dimensional structure. The memory cell array having the three-dimensional structure is described below with reference to FIGS. 3B and 3C.

FIG. 3B is a diagram illustrating an embodiment (110_2) of the memory cell array 110 illustrated in FIG. 1.

Referring to FIG. 3B, the memory cell array 110_2 may include the plurality of memory blocks BLK1 to BLKz. For convenience of explanation, the internal configuration of the first memory block BLK1 is illustrated in FIG. 3B, whereas the internal configuration of each of the memory blocks BLK2 to BLKz is illustrated. The second to zth memory blocks BLK2 to BLKz may be configured in the same manner as the first memory block BLK1.

Referring to FIG. 3B, the first memory block BLK1 may include a plurality of cell strings CS11 to CS1m and CS21 to CS2m. According to an embodiment, each of the cell strings CS11 to CS1m and CS21 to CS2m may be formed in a 'U' shape. In the first memory block BLK1, 'm' cell strings may be arranged in a row direction (i.e., +X direction). For convenience of explanation, as illustrated in FIG. 3B, two cell strings may be arranged in a column direction (i.e., +Y direction). Alternatively, three or more cell strings may be arranged in the column direction.

Each of the cell strings CS11 to CS1m and CS21 to CS2m may include at least one source selection transistor SST, the first to nth memory cells MC1 to MCn, the pipe transistor PT, and at least one drain selection transistor DST.

The selection transistors SST and DST and the memory cells MC1 to MCn may have similar structures to each other. According to an embodiment, each of the selection transistors SST and DST and the memory cells MC1 to MCn may include a channel layer, a tunneling insulating layer, a charge storage layer and a blocking insulating layer. According to an embodiment, a pillar for providing a channel layer may be provided in each cell string. According to an embodiment, a pillar for providing at least one of the channel layer, the tunneling insulating layer, the charge storage layer and the blocking insulating layer may be provided in each cell string.

The source selection transistor SST of each cell string may be coupled between the common source line CSL and the memory cells MC1 to MCp.

According to an embodiment, source selection transistors of cell strings arranged in the same row may be coupled to a source selection line extending in a row direction, and source selection transistors of cell strings may be coupled to different source selection lines. As illustrated in FIG. 3B, source selection transistors of the cell strings CS11 to CS1m in the first row may be coupled to the first source selection line SSL1. Source selection transistors of the cell strings CS21 to CS2m in the second row may be coupled to the second source selection line SSL2.

According to an embodiment, the source selection transistors of the cell strings CS11 to CS1m and CS21 to CS2m may be commonly coupled to one source selection line.

The first to nth memory cells MC1 to MCn of each cell string may be coupled between the source selection transistor SST and the drain selection transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a reverse direction to +Z direction and coupled in series between the source selection transistor SST and the pipe transistor PT. The (p+1)th to nth memory cells MCp+1 to MCn may be sequentially arranged in +Z direction and coupled in series between the pipe transistor PT and the drain selection transistor DST. The first to pth memory cells MC1 to MCp and the (p+1)th to nth memory cells MCp+1 to MCn may be coupled through the pipe transistor PT.

Gates of the first to nth memory cells MC1 to MCn of each cell string may be coupled to the first to nth word lines WL1 to WLn, respectively.

A gate of the pipe transistor PT of each cell string may be coupled to a pipe line PL.

The drain selection transistor DST of each cell string may be coupled between the corresponding bit line and the memory cells MCp+1 to MCn. Cell strings arranged in the row direction may be coupled to a drain selection line extending in the row direction. Drain selection transistors of the cell strings CS11 to CS1m in the first row may be coupled to the first drain selection line DSL1. Drain selection transistors of the cell strings CS21 to CS2m in the second row may be coupled to a second drain selection line DSL2.

Cell strings arranged in the column direction may be coupled to a bit line extending in the column direction. As illustrated in FIG. 3B, the cell strings CS11 and CS21 in the first column may be coupled to the first bit line BL1. The cell strings CS1m and CS2m in an mth row may be coupled to an mth bit line BLm.

Memory cells coupled to the same word line in the cell strings arranged in the row direction may form a single page. For example, memory cells coupled to the first word line WL1 in the cell strings CS11 to CS1m in the first row may form a single page. Memory cells coupled to the first word line WL1 in the cell strings CS21 to CS2m in the second row may form another page. When one of the drain selection lines DSL1 and DSL2 is selected, cell strings arranged in one row direction may be selected. When one of the word lines WL1 to WLn is selected, one page may be selected from the selected cell strings.

FIG. 3C is a diagram illustrating an embodiment (110_3) of the memory cell array 110 illustrated in FIG. 1.

Referring to FIG. 3C, the memory cell array 110_3 may include a plurality of memory blocks BLK1' to BLKz'. For convenience of explanation, the internal configuration of the first memory block BLK1' is illustrated in FIG. 3C, whereas the internal configuration of each of the second to zth memory blocks BLK2' to BLKz' is omitted. The second to zth memory blocks BLK2' to BLKz' may be configured in the same manner as the first memory block BLK1'.

The first memory block BLK1' may include a plurality of cell strings CS11' to CS1m' and CS21' to CS2m'. Each of the plurality of cell strings CS11' to CS1m' and CS21' to CS2m' may extend in +Z direction. In the first memory block BLK1', 'm' cell strings may be arranged in +X direction. For convenience of explanation, as illustrated in FIG. 3C, two cell strings may be arranged in +Y direction. Three or more cell strings may be arranged in the column direction.

Each of the cell strings CS11' to CS1m' and CS21' to CS2m' may include at least one source selection transistor SST, the first to nth memory cells MC1 to MCn, and at least one drain selection transistor DST.

The source selection transistor SST of each cell string may be coupled between the common source line CSL and the memory cells MC1 to MCn. Source selection transistors of cell strings arranged in the same row may be coupled to the same source selection line. Source selection transistors of the cell strings CS11' to CS1m' arranged in the first row may be coupled to the first source selection line SSL1. Source selection transistors of the cell strings CS21' to CS2m' arranged in the second row may be coupled to the second source selection line SSL2. According to an embodiment, the source selection transistors of the cell strings CS11' to CS1m' and CS21' to CS2m' may be commonly coupled to one source selection line.

The first to nth memory cells MC1 to MCn of each cell string may be coupled in series between the source selection transistor SST and the drain selection transistor DST. Gates of the first to nth memory cells MC1 to MCn may be coupled to the first to nth word lines WL1 to WLn, respectively.

The drain selection transistor DST of each cell string may be coupled between the corresponding bit line and the memory cells MC1 to MCn. Drain selection transistors of cell strings arranged in the row direction may be coupled to a drain selection line extending in the row direction. Drain selection transistors of the cell strings CS11' to CS1m' in the first row may be coupled to the first drain selection line DSL1. Drain selection transistors of the cell strings CS21' to CS2m' in the second row may be coupled to the second drain selection line DSL2.

As a result, the memory block BLK1' of FIG. 3C may have a similar equivalent circuit to the memory block BLK1 of FIG. 3B except that the pipe transistor PT is removed from each cell string.

Figure 4:
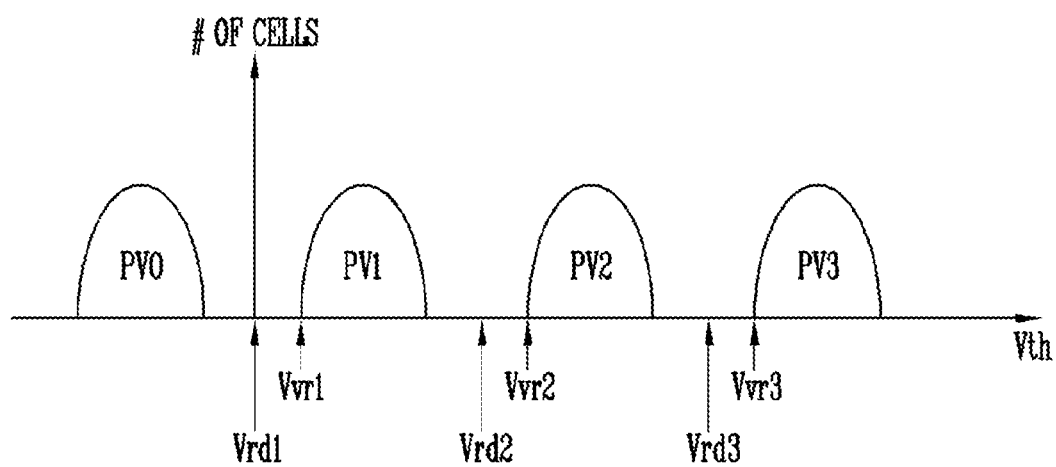
FIG. 4 is a diagram illustrating an example of threshold voltage distributions of memory cells.

FIG. 4 is a diagram illustrating an example of threshold voltage distributions of memory cells included in the semiconductor memory device 100 illustrated in FIG. 1. For example, FIG. 4 illustrates threshold voltage distributions of the memory cells included in the semiconductor memory device, each of which is a multi-level cell (MLC) storing 2-bit data.

Referring to FIG. 4, a horizontal axis indicates threshold voltages of memory cells and a vertical axis indicates the number of memory cells. As illustrated in FIG. 4, the memory cells may have an erase state PV0, a first program state PV1, a second program state PV2 and a third program state PV3. However, the embodiments not limited thereto. The number of program states that the memory cells have may vary. For example, each of the memory cells included in the memory cell array 110 of the semiconductor memory device 100 may be a single-level cell (SLC) storing 1-bit data. In an example, each of the plurality of memory cells included in the memory cell array 110 of the semiconductor memory device 100 may be a triple-level cell (TLC) storing 3-bit data. In an example, each of the plurality of memory cells included in the memory cell array 110 of the semiconductor memory device 100 may be a quad-level cell (QLC) storing 4-bit data. In an example, each of the plurality of memory cells included in the memory cell array 110 of the semiconductor memory device 100 may store 5 or more bits of data.

Since a nonvolatile memory device is a non-rewritable memory device, an erase operation may be performed on memory cells before a program operation is performed thereon, so that the memory cells may have the erase state PV0. After the memory cells have the erase state PV0, a program loop may be performed on the memory cells several times so that the memory cells may be programmed into one of the erase state PV0 and the first to third program states PV1 to PV3.

Threshold voltages of the memory cells having the first program state PV1 may be greater than a first program verify voltage Vvr1. Threshold voltages of the memory cells having the second program state PV2 may be greater than a second program verify voltage Vvr2. Threshold voltages of memory cells having the third program state PV3 may be greater than a third program verify voltage Vvr3. According to an embodiment, the first program verify voltage Vvr1, the second program verify voltage Vvr2 and the third program verify voltage Vvr3 may be positive voltages greater than a ground voltage.

During a read operation of the semiconductor memory device, to read out a threshold voltage state corresponding to data stored in a memory cell, first, second and third read voltages Vrd1, Vrd2 and Vrd3 may be applied. The first read voltage Vrd1 may have a smaller value than the first program verify voltage Vvr1. The second read voltage Vrd2 may have a smaller value than the second program verify voltage Vvr2. The third read voltage Vrd3 may have a smaller value than the third program verify voltage Vvr3.

Figure 5:
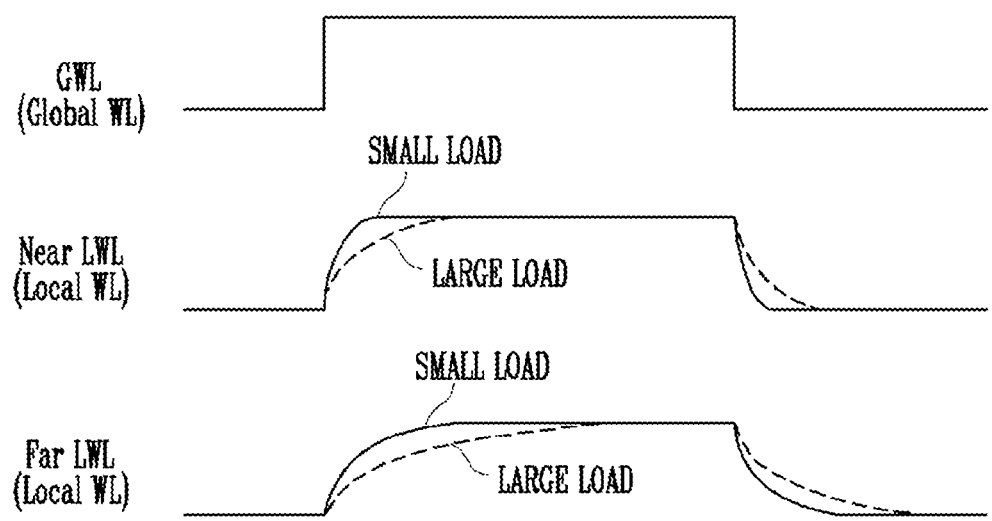
FIG. 5 is a graph illustrating setting time when a voltage is applied to a word line according to a method of operating a general semiconductor memory device.
Figure 6:
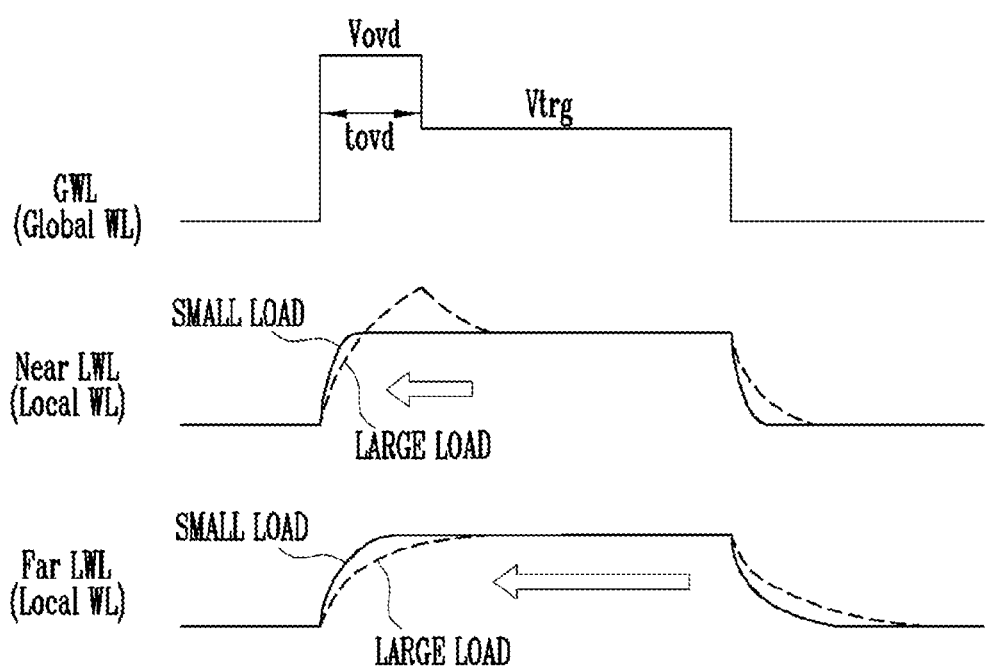
FIG. 6 is a graph illustrating settling time when a voltage is applied to a word line according to a method of operating a semiconductor device using an overdrive voltage.

FIG. 5 is a graph illustrating a settling time when a voltage is applied to a word line in a method of operating a general semiconductor memory device. FIG. 6 is a graph illustrating a settling time when a voltage is applied to a word line in a method of operating a semiconductor memory device using an overdrive voltage.

With a higher density of a semiconductor memory device, load of a word line may increase and settling time may increase. Referring to FIG. 5, changes in voltages of a near local word line and a far local word line are illustrated when a predetermined driving voltage is applied to a global word line GWL. A voltage of the far local word line may increase at a slower rate than that of the near local word line. When word lines are located at the same position, a voltage of a word line having a larger load may increase at a slower rate than that of a word line having a smaller load. In FIG. 5, the voltage of the word line having the large load is indicated by dashed lines. When the load of the word line increases, the settling time may increase, and an operation time of the semiconductor memory device may increase. As a result, performance of the semiconductor memory device may be degraded.

A method of operating a semiconductor memory device using an overdrive voltage is described with reference to FIG. 6. In the specification, a voltage which is applied at an initial stage and has a higher voltage than a target voltage level by a predetermined level is referred to as an "overdrive voltage," and applying an operation voltage by using the overdrive voltage is referred to as an "overdrive operation." In addition, a time during which the overdrive operation is performed is referred to as an "overdrive duration." To reduce the settling time, by the overdrive operation, an overdrive voltage Vovd having a greater voltage level than a target voltage level Vtrg may be applied during a predetermined time tovd at the initial stage of driving. When the overdrive voltage Vovd is applied, a voltage of a local word line may rapidly increase in comparison with FIG. 5. When applying the overdrive voltage Vovd is completed, the voltage having the target voltage level Vtrg may be applied. Thus, the voltage of the local word line may converge to the target voltage level Vtrg. In comparison with FIG. 5, the settling time may be reduced by applying the overdrive voltage Vovd having a greater level than the target voltage level Vtrg during the predetermined time tovd of the initial stage of driving, so that an operating speed of the semiconductor memory device may be improved. According to an embodiment, the semiconductor memory device may apply an operation voltage applied to a word line of the semiconductor memory device by using the overdrive voltage.

As described below, in a semiconductor memory device and a method of operating the semiconductor memory device according to an embodiment, an overdrive set parameter may be determined based on the current temperature of the semiconductor memory device. Therefore, the overdrive operation of the semiconductor memory device may be adaptively controlled according to temperature changes. In a semiconductor memory device and a method of operating the semiconductor memory device according to an embodiment, an overdrive set parameter may be determined on the basis of program states of selected memory cells during a program operation. Therefore, an overdrive operation of the semiconductor memory device may be adaptively controlled as a program loop is performed. Therefore, an operating speed of the semiconductor memory device may be improved.

FIG. 7A is a timing diagram illustrating a program method of a general semiconductor memory device. FIG. 7B is a timing diagram illustrating a program method of a semiconductor memory device using an overdrive voltage.

Referring to FIG. 7A, according to a general program method, program loops PL1_1, PL1_2, ..., PL2_1, ..., and PL3_1, ... may be performed. However, FIG. 7A illustrate only some program loops. Among the above-described program loops, by the program loops PL1_1, PL1_2, ..., memory cells corresponding to the first program state PV1 may be completely programmed. In addition, by program loops PL2_1, ..., memory cells corresponding to the second program state PV2 may be completely programmed. In addition, by the program loops PL3_1, ..., memory cells corresponding to the third program state PV3 may be completely programmed.

Referring to FIG. 7A, a program pulse Vpgm1_1 may be applied in the program loop PL1_1. After the program pulse Vpgm1_1 is applied, the program verify voltages Vvr1, Vvr2, and Vvr3 may be applied. The program verify voltage Vvr1 may be applied to perform a program verify operation on the memory cells corresponding to the first program state PV1. The program verify voltage Vvr2 may be applied to perform a program verify operation on the memory cells corresponding to the second program state PV2. The program verify voltage Vvr3 may be applied to perform a program verify operation on the memory cells corresponding to the third program state PV3. After the program verify voltages Vvr1, Vvr2, and Vvr3 are applied, the program loop PL1_2 may be performed to change threshold voltages of memory cells which are not completely programmed. A program pulse Vpgm1_2 may be performed in the program loop PL1_2. Subsequently, the program verify voltages Vvr1, Vvr2, and Vvr3 may be applied.

After the memory cells corresponding to the first program state PV1 are completely programmed, the program loops PL2_1, ... may be performed. A program pulse Vpgm2_1 may be applied in the program loop PL2_1. After the program pulse Vpgm2_1 is applied, the program verify voltages Vvr2 and VVr3 corresponding to the second and third program states PV2 and PV3 may be applied. Since the memory cells corresponding to the first program state PV1 are completely programmed, the program verify voltage Vvr1 corresponding to the first program state PV1 may not be applied in the program loop PL2_1. The program loop may be repeated until the program operation of the memory cells corresponding to the second program state PV2 is completed.

After memory cells corresponding to the second program state PV2 are programmed, the program loops PL3_1, ... may be performed. A program pulse Vpgm3_1 may be applied in the program loop PL3_1. After the program pulse Vpgm3_1 is applied, a program verify voltage Vvr3 corresponding to the third program state PV3 may be applied. Since the memory cells corresponding to the first and second program states PV1 and PV2 are completely programmed, the program verify voltages Vvr1 and Vvr2 corresponding to the first and second program states PV1 and PV2, respectively, may not be applied in the program loop PL3_1. The above program loop may be repeated until the program operation on the memory cells corresponding to the third program state PV3 are completed.

FIG. 7B is a timing diagram illustrating a program method by which an overdrive operation is performed when the program verify voltages Vvr1, Vvr2, and Vvr3 are applied. The program pulse Vpgm1_1 in the program loop PL1_1 as illustrated in FIG. 7B may be applied in the same manner as described in FIG. 7A. An overdrive operation may also be performed when a program verify voltage is applied. In other words, when the program verify voltage Vvr1 corresponding to the first program state PV1 is applied, a voltage having an overdrive voltage level Vvi1 greater than that of the program verify voltage Vvr1 may be applied first during a predetermined period. In addition, when the program verify voltage Vvr2 corresponding to the second program state PV2 is applied, a voltage having an overdrive voltage level Vvi2 greater than that of the program verify voltage Vvr2 may be applied during a predetermined period. When the program verify voltage Vvr3 corresponding to the third program state PV3 is applied, a voltage having an overdrive voltage level Vvi3 greater than that of the program verify voltage Vvr3 may be applied during a predetermined period. The same program verify voltages may be applied in different program loops.

Referring to the descriptions made with reference to FIGS. 5 and 6, a program verify time may be reduced by using the overdrive operation as illustrated in FIG. 7B. As a result, the entire program time may be reduced, so that an operating speed of the semiconductor memory device may be increased.

In a semiconductor memory device and an operating method thereof according to an embodiment, when the overdrive voltage as illustrated in FIG. 7B is used, an overdrive set parameter may be determined on the basis of the current temperature of the semiconductor memory device 100.

Therefore, the overdrive operation of the semiconductor memory device 100 may be adaptively controlled according to temperature variations. In a semiconductor memory device and an operating method thereof according to an embodiment, when the overdrive voltage as illustrated in FIG. 7B is used, an overdrive set parameter may be determined on the basis of program states of selected memory cells during a program operation. The overdrive operation of the semiconductor memory device 100 may be adaptively controlled as a program loop is performed. As a result, the operating speed of the semiconductor memory device 100 may be improved.

Figure 8:
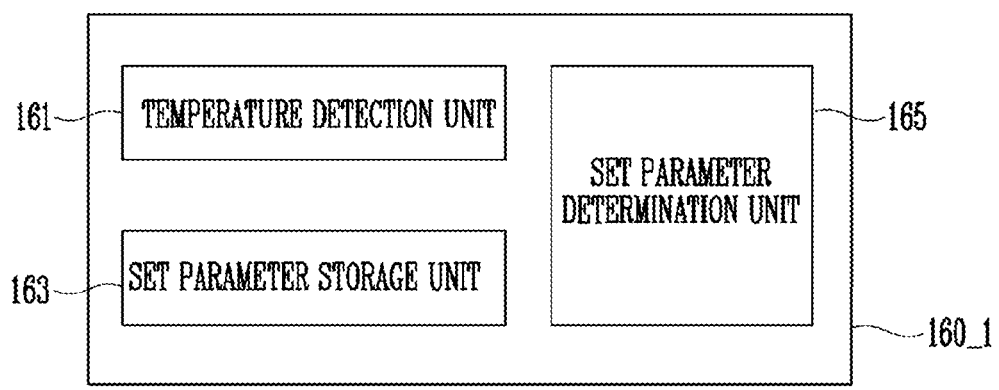
FIG. 8 is a block diagram illustrating an embodiment of an overdrive setting unit illustrated in FIG. 1.

FIG. 8 is a block diagram illustrating an embodiment of the overdrive setting unit 160_1 illustrated in FIG. 1.

Referring to FIG. 8, the overdrive setting unit 160_1 may include a temperature detection unit 161, a set parameter storage unit 163 and a set parameter determination unit 165. The temperature detection unit 161 may generate temperature information by sensing the temperature of the semiconductor memory device 100. In other words, the temperature detection unit 161 may include a temperature sensor provided in or adjacent to the semiconductor memory device 100.

The parameter storage unit 163 may store a plurality of set parameters with respect to the overdrive operation using the operation voltage. According to an embodiment, the set parameter storage unit 163 may include a look-up table consisting of temperature values in a predetermined range and set parameters corresponding thereto. The set parameters stored in the set parameter storage unit 163 may include an overdrive voltage level of an overdrive voltage applied during an overdrive operation and an overdrive duration for which the overdrive operation is performed.

The set parameter determination unit 165 may determine one of the plurality of set parameters stored in the set parameter storage unit 163 as an overdrive set parameter of the operation voltage on the basis of temperature information generated by the temperature detection unit 161. The set parameter determination unit 165 may determine an overdrive set parameter corresponding to the corresponding temperature with reference to the set parameter storage unit 163 on the basis of the temperature information. For example, the set parameter determination unit 165 may select one of the overdrive voltage levels stored in the set parameter storage unit 163 on the basis of the temperature information. In addition, the set parameter determination unit 165 may select one of the overdrive durations stored in the set parameter storage unit 163 on the basis of the temperature information.

The control logic 140 illustrated in FIG. 1 may control the address decoder 120 to apply the operation voltage having the greater overdrive voltage level than a target voltage level during the overdrive duration on the basis of the overdrive set parameter determined by the overdrive setting unit 160_1. The control logic 140 may control the address decoder 120 to apply the operation voltage having the target voltage level after the overdrive operation. Accordingly, the operation voltage applied to a word line may decrease from the overdrive voltage level to the target voltage level.

The overdrive set parameter determined by the overdrive setting unit 160_1 and the overdrive operation performed based on the determined overdrive set parameter will be described with reference to FIGS. 9A to 10C.

Figure 9A:
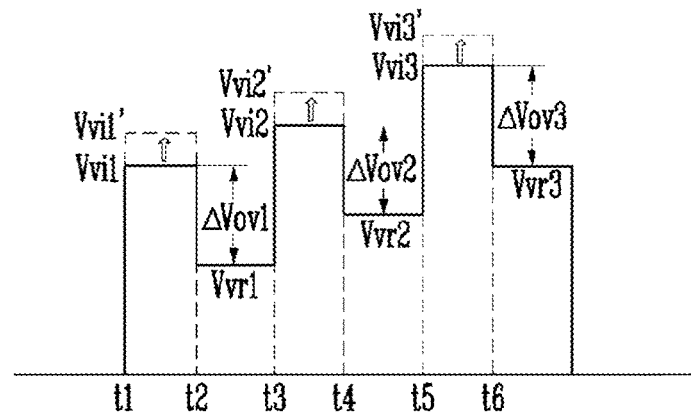
FIGS. 9A, 9B and 9C are diagrams illustrating that overdrive voltage levels are determined by an overdrive setting unit.
Figure 9B:
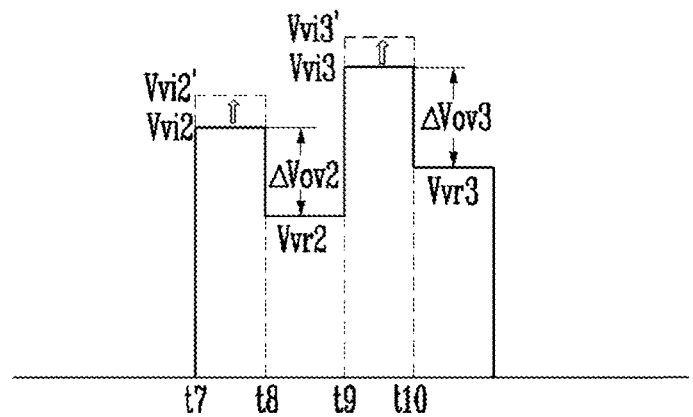
Figure 9C:
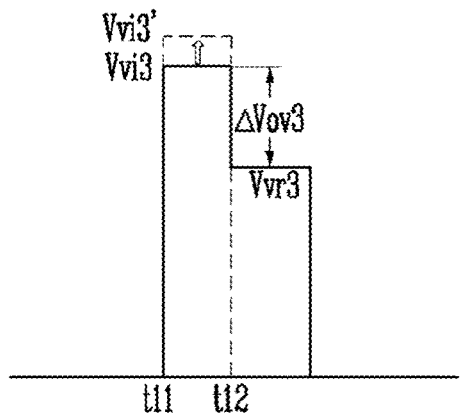

FIGS. 9A, 9B and 9C are diagrams illustrating that overdrive voltage levels are determined by an overdrive setting unit.

Referring to FIG. 9A, a program verify voltage applied during a program operation of a semiconductor memory device according to an embodiment is illustrated. For example, the program verify voltage illustrated in FIG. 9A may be the program verify voltage applied in the program loop PL1_1 as illustrated in FIG. 7B.

A program verify operation corresponding to the first program state PV1 in the program loop PL1_1 may be performed first. An overdrive operation may start at a time t1. A voltage having the overdrive voltage level Vvi1 may be applied to a word line. The overdrive operation may continue until a time t2. The overdrive operation may finish at the time t2, and a voltage having the program verify voltage Vvr1 having the original target voltage level may be applied. Settling time of the word line may be reduced as a difference ΔVov1 between the overdrive voltage level Vvi1 and the program verify voltage Vvr1 increases.

At a time t3, the program verify operation for the first program state PV1 may finish, and a program verify operation corresponding to the second program state PV2 may be performed. At the time t3, an overdrive operation may start. Thus, a voltage having the overdrive voltage level Vvi2 may be applied to the word line. The overdrive operation may continue until a time t4. At the time t4, the overdrive operation may finish, and a voltage having the program verify voltage Vvr2 having the original target voltage level may be applied. Settling time of the word line may be reduced as a difference ΔVov2 between the overdrive voltage level Vvi2 and the program verify voltage Vvr2 increases.

At a time t5, the program verify operation for the second program state PV2 may finish, and a program verify operation corresponding to the third program state PV3 may be performed. At the time t5, an overdrive operation may start. Thus, a voltage having the overdrive voltage level Vvi3 may be applied to the word line. The overdrive operation may continue until a time t6. At the time t6, the overdrive operation may finish, and the program verify voltage Vvr3 having the original target voltage level may be applied. Settling time of the word line may be reduced as a difference ΔVov3 between the overdrive voltage level Vvi3 and the program verify voltage Vvr3 increases.

The overdrive setting unit 160_1 of the semiconductor memory device according to an embodiment may determine the overdrive voltage levels Vvi1, Vvi2, and Vvi3 of the voltages applied during the overdrive operation on the basis of the temperature of the semiconductor memory device 100. For example, when the temperature of the semiconductor memory device 100 is low, the settling time of the word line may be relatively increased. Therefore, to offset the above changes in the settling time, when the temperature of the semiconductor memory device 100 decreases, as indicated by dashed lines in FIG. 9A, the overdrive voltage levels Vvi1, Vvi2, and Vvi3 may increase to overdrive voltage levels Vvi1', Vvi2', and Vvi3', respectively. In other words, the set parameter determination unit 165 of the overdrive setting unit 160_1 may determine higher voltage levels as the overdrive voltage levels Vvi1, Vvi2, and Vvi3 when the temperature information of the temperature detection unit 161 indicates lower temperature, and lower voltage levels as the overdrive voltage levels Vvi1, Vvi2, and Vvi3 when the temperature information of the temperature detection unit 161 indicates higher temperature. Therefore, even when the temperature of the semiconductor memory device 100 decreases, a short settling time of the word line with respect to the voltage may be maintained by increasing the overdrive voltage levels Vvi1, Vvi2, and Vvi3. Therefore, a program verify speed may be improved during a program operation of the semiconductor memory device. On the other hand, when the temperature of the semiconductor memory device 100 increases, a desired settling time of the word line voltage may be maintained by reducing the overdrive voltage levels Vvi1, Vvi2, and Vvi3.

Referring to FIG. 9A, all overdrive voltage levels Vvi1, Vvi2, and Vvi3 may increase as the temperature decreases. However, one or two of the overdrive voltage levels Vvi1, Vvi2, and Vvi3 may be selectively increased. Alternatively, contrary to FIG. 9A, the overdrive voltage levels may be reduced as the temperature decreases.

Referring to FIG. 9B, a program verify voltage applied during a program operation of the semiconductor memory device according to an embodiment is illustrated. For example, the program verify voltage illustrated in FIG. 9B may be the program verify voltage applied in the program loop PL2_1 as illustrated in FIG. 7B. Therefore, the program verify voltage Vvr1 and the overdrive voltage level Vvi1 for the first program state PV1 may not be applied.

A program verify operation corresponding to the second program state PV2 in the program loop PL2_1 may be performed first. An overdrive operation may start at a time t7. A voltage having the overdrive voltage level Vvi2 may be applied to the word line. The overdrive operation may continue until a time t8. At the time t8, the overdrive operation may finish, and the program verify voltage Vvr2 having the original target voltage level may be applied. The settling time of the word line may be reduced as the difference ΔVov2 between the overdrive voltage level Vvi2 and the program verify voltage Vvr2 increases.

At a time t9, the program verify operation for the second program state PV2 may finish, and a program verify operation corresponding to the third program state PV3 may be performed. At the time t9, an overdrive operation may start. A voltage having the overdrive voltage level Vvi3 may be applied to the word line. The overdrive operation may continue until a time t10. At the time t10, the overdrive operation may finish, and the program verify voltage Vvr3 having the original target voltage level may be applied. The settling time of the word line may be reduced as the difference ΔVov3 between the overdrive voltage level Vvi3 and the program verify voltage Vvr3 increases.

When the temperature of the semiconductor memory device 100 is low, the settling time of the word line may increase. Therefore, to offset the above changes in the settling time, when the temperature of the semiconductor memory device 100 decreases, as indicated by dashed lines in FIG. 9B, the overdrive voltage levels Vvi2 and Vvi3 may increase to the overdrive voltage levels Vvi2' and Vvi3', respectively. Therefore, even when the temperature of the semiconductor memory device 100 decreases, a short settling time with respect to the word line voltage may be maintained by increasing the overdrive voltage levels Vvi2 and Vvi3.

FIG. 9B illustrates that both overdrive voltage levels Vvi2 and Vvi3 increase as the temperature decreases. However, one of the overdrive voltage levels Vvi2 and Vvi3 may be selectively selected. Alternatively, contrary to FIG. 9A, the overdrive voltage levels may be reduced as the temperature decreases.

Referring to FIG. 9C, a program verify voltage applied during a program operation of the semiconductor memory device according to an embodiment is illustrated. For example, the program verify voltage illustrated in FIG. 9C may be the program verify voltage applied in the program loop PL3_1 illustrated in FIG. 7B. Therefore, the program verify voltages Vvr1 and Vvr2 for the first and second program states PV1 and PV2 and the voltages having the overdrive voltage levels Vvi1 and Vvi2 corresponding thereto may not be applied.

At a time t11, a program verify operation corresponding to the third program state PV3 may be performed. At the time t11, an overdrive operation may start. Therefore, a voltage having the overdrive voltage level Vvi3 may be applied to the word line. The overdrive operation may continue until a time t12. At the time t12, the overdrive operation may finish, and the program verify voltage Vvr3 having the original target voltage level may be applied. The settling time of the word line may be reduced as the difference ΔVov3 between the overdrive voltage level Vvi3 and the program verify voltage Vvr3 increases.

When the temperature of the semiconductor memory device 100 is low, the settling time of the word line may increase. Therefore, to offset the above changes in the settling time, when the temperature of the semiconductor memory device 100 decreases, as indicated by dashed lines in FIG. 9C, the overdrive voltage level Vvi3 may increase to the overdrive voltage level Vvi3'. Therefore, even when the temperature of the semiconductor memory device 100 decreases, a short settling time for the word line voltage may be maintained by increasing the overdrive voltage level Vvi3.

FIGS. 9A to 9C illustrate an embodiment in which overdrive voltage levels are changed on the basis of the temperature of the semiconductor memory device 100. According to an embodiment, an overdrive duration for which an overdrive operation is performed may be changed on the basis of the temperature of the semiconductor memory device 100. Operations of changing the overdrive duration will be described below with reference to FIGS. 10A to 10C.

Figure 10A:
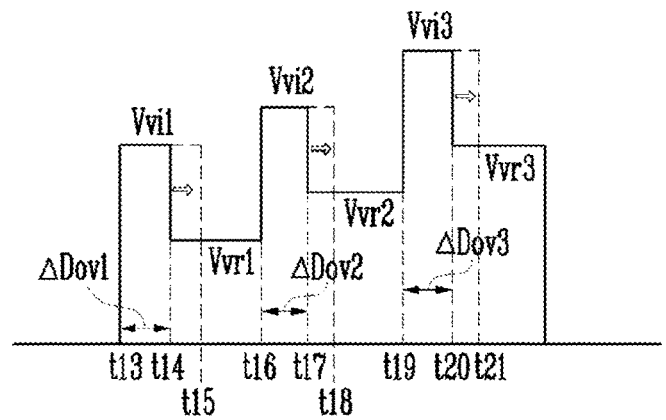
FIGS. 10A, 10B and 10C are diagrams illustrating that an overdrive duration is determined by an overdrive setting unit.
Figure 10B:
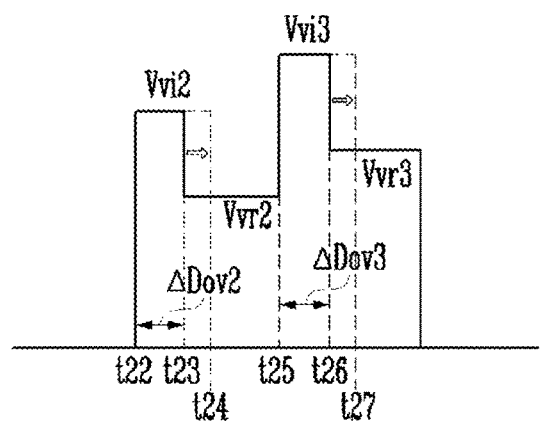
Figure 10C:
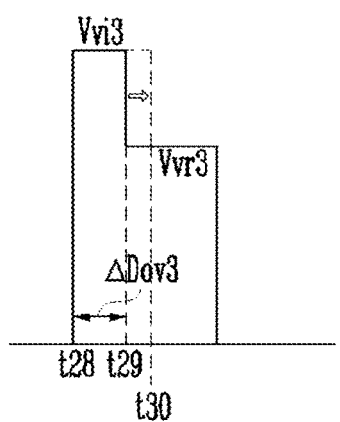

FIGS. 10A, 10B and 10C are diagrams illustrating that an overdrive duration is determined by an overdrive setting unit.

Referring to FIG. 10A, a program verify voltage applied during a program operation of the semiconductor memory device according to an embodiment is illustrated. More specifically, the program verify voltage illustrated in FIG. 10A may be the program verify voltage applied in the program loop PL1_1 illustrated in FIG. 7B.

The program verify operation corresponding to the first program state PV1 in the program loop PL1_1 may be performed first. An overdrive operation may start at a time t13. A voltage having the overdrive voltage level Vvi1 may be applied to the word line. The overdrive operation may continue until a time t14. The overdrive operation may finish at the time t14, and the program verify voltage Vvr1 having the original target voltage level may be applied.

At a time t16, a program verify operation for the first program state PV1 may finish, and a program verify operation corresponding to the second program state PV2 may be performed. An overdrive operation may start at the time t16. A voltage having the overdrive voltage level Vvi2 may be applied to the word line. The overdrive operation may continue until a time t17. At the time t17, the overdrive operation may finish, and the program verify voltage Vvr2 having the original target voltage level may be applied.

At a time t19, the program verify operation for the second program state PV2 may finish, and a program verify operation corresponding to the third program state PV3 may be performed. At the time t19, an overdrive operation may start. Therefore, a voltage having the overdrive voltage level Vvi3 may be applied to the word line. The overdrive operation may continue until a time t20. At the time t20, the overdrive operation may finish, and the program verify voltage Vvr3 having the original target voltage level may be applied.

In the semiconductor memory device according to an embodiment, the set parameter determination unit 165 of the overdrive setting unit 160_1 may determine the overdrive duration for which the overdrive operation is performed on the basis of the temperature information generated by the temperature detection unit 161.

For example, when the temperature of the semiconductor memory device 100 is low, the settling time of the word line may increase. Therefore, to offset the above changes in the settling time, when the temperature of the semiconductor memory device 100 decreases, as indicated by dashed lines in FIG. 10A, the overdrive duration may be increased. In other words, when the temperature of the semiconductor memory device 100 decreases, the time at which the overdrive operation finishes may be delayed from the times t14, t17, and t20 to times t15, t18, and t21, respectively. Thus, since the duration for which the overdrive operation is performed is increased, the increase in the settling time caused by the decrease in the temperature of the semiconductor memory device 100 may be offset.

On the other hand, when the temperature of the semiconductor memory device 100 increases, a desired settling time of the word line voltage may be maintained by determining a shorter overdrive duration.

FIG. 10A illustrates that all times when an overdrive operation finishes are delayed. However, one or two of the times t14, t17, and t20 at which the overdrive operation finishes may be selectively delayed. Alternatively, the times at which the overdrive operation finishes may be advanced.

The duration for which the overdrive operation is performed may be reduced when the temperature decreases.

Referring to FIG. 10B, a program verify voltage applied during a program operation of the semiconductor memory device according to an embodiment is illustrated. For example, the program verify voltage illustrated in FIG. 10B may be the program verify voltage applied in the program loop PL2_1 illustrated in FIG. 7B.

A program verify operation corresponding to the second program state PV2 in the program loop PL2_1 may be performed. An overdrive operation may start at a time t22. Thus, a voltage having the overdrive voltage level Vvi2 may be applied to the word line. The overdrive operation may continue until a time t23. At the time t23, the overdrive operation may finish, and the program verify voltage Vvr2 having the original target voltage level may be applied.

At a time t25, the program verify operation corresponding to the second program state PV2 may finish, and a program verify operation corresponding to the third program state PV3 may be performed. At the time t25, an overdrive operation may start. Thus, a voltage having the overdrive voltage level Vvi3 may be applied to the word line. The overdrive operation may continue until a time t26. At the time t26, the overdrive operation may finish, and the program verify voltage Vvr3 having the original target voltage level may be applied.

When the temperature of the semiconductor memory device 100 is low, the settling time of the word line may be increased. Therefore, in order to offset the above changes in the settling time, when the temperature of the semiconductor memory device 100 is reduced, as indicated by dashed lines in FIG. 10B, an overdrive duration may be increased. In other words, when the temperature of the semiconductor memory device 100 is reduced, the time at which the overdrive operation finishes may be delayed from the times t23 and t26 to times t24 and t27, respectively. Thus, the duration for which the overdrive operation is performed may be increased, so that the increase in the settling time caused by the decrease in the temperature of the semiconductor memory device 100 may be offset.

Referring to FIG. 10B, all times at which the overdrive operation finishes are delayed with the decrease in temperature. However, one of the times t23 and t25 at which the overdrive operation finishes may be selectively delayed. Alternatively, the time at which the overdrive operation finishes may be advanced. Thus, the duration for which the overdrive operation is performed may be reduced when the temperature decreases.

Referring to FIG. 10C, a program verify voltage applied during a program operation of the semiconductor memory device according to an embodiment is illustrated. For example, the program verify voltage illustrated in FIG. 10C may be the program verify voltage applied in the program loop PL3_1 illustrated in FIG. 7B.

A program verify operation corresponding to the third program state PV3 in the program loop PL3_1 may be performed. At a time t28, an overdrive operation may start. Thus, a voltage having the overdrive voltage level Vvi3 may be applied to the word line. The overdrive operation may continue until a time t29. At the time t29, the overdrive operation may finish, and the program verify voltage Vvr3 having the original target voltage level may be applied.

When the temperature of the semiconductor memory device 100 is low, the settling time of the word line may increase. Therefore, to offset the above changes in the settling time, when the temperature of the semiconductor memory device 100 is reduced, as indicated by dashed lines in FIG. 10C, an overdrive duration may be increased. In other words, when the temperature of the semiconductor memory device 100 decreases, the time at which the overdrive operation finishes may be delayed from the time t29 to a time t30. Thus, the duration for which the overdrive operation is performed may increase, so that the increase in the settling time caused by the decrease in the temperature of the semiconductor memory device 100 may be offset.

Figure 11:
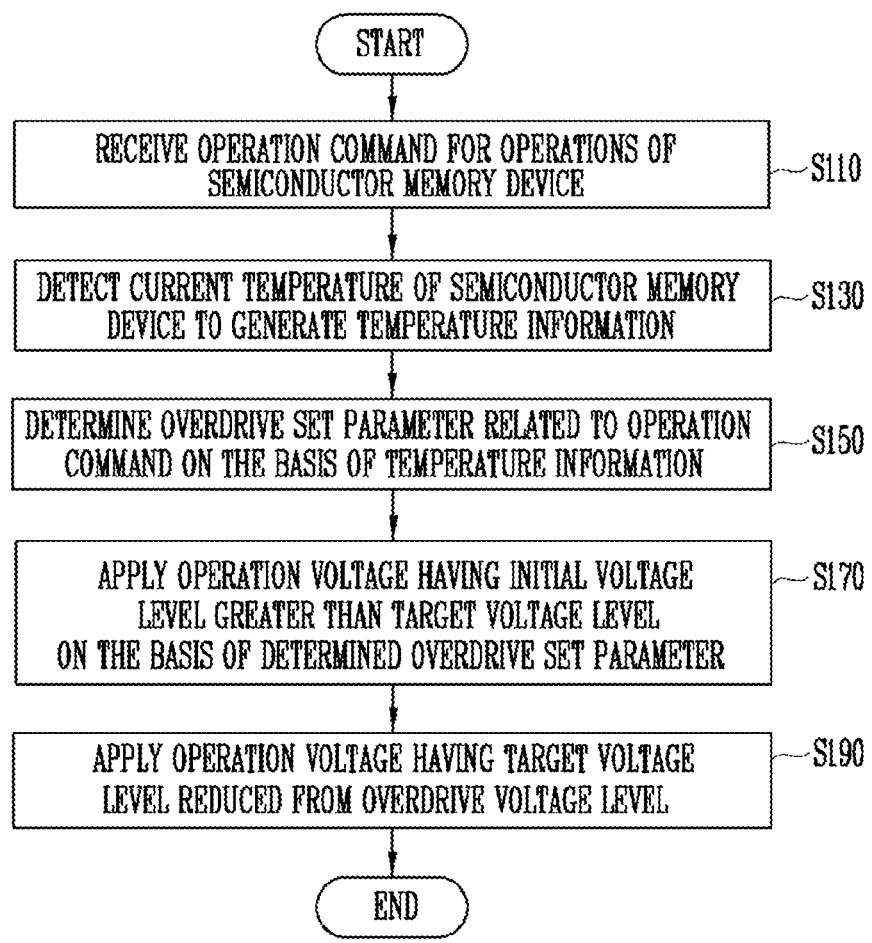
FIG. 11 is a flowchart illustrating a method of operating a semiconductor memory device according to an embodiment.

FIG. 11 is a flowchart illustrating a method of operating a semiconductor memory device according to an embodiment. Referring to FIG. 11, the same operating method as described with reference to FIGS. 8 to 10 is illustrated. A method of operating a semiconductor memory device according to an embodiment may include receiving an operation command for operations of the semiconductor memory device at step S110, detecting the current temperature of the semiconductor memory device to generate temperature information at step S130, determining an overdrive set parameter of an operation voltage related to the operation command on the basis of the temperature information at step S150, applying an operation voltage having a overdrive voltage level greater than a target voltage level on the basis of the determined overdrive set parameter at step S170, and applying an operation voltage having the target voltage level by decreasing the overdrive voltage level at step S190.

At step S110, the operation command for the operations of the semiconductor memory device may be received. According to an embodiment, the operation command may be a program command. According to an embodiment, the operation command may be a read command. An operating method when the read command is received is described below with reference to FIGS. 13A and 13B.

At step S130, temperature information may be generated by a temperature sensor included in or adjacent to the semiconductor memory device. In other words, the temperature information may be generated by the temperature detection unit 161 illustrated in FIG. 8.

At step S150, on the basis of the temperature information, an overdrive set parameter of an operation voltage related to the operation command may be determined. According to an embodiment, the overdrive set parameter may be an overdrive voltage level. As described above with reference to FIGS. 9A to 9C, the overdrive voltage levels may be determined or changed. According to an embodiment, the overdrive set parameter may be an overdrive duration. As described above with reference to FIGS. 10A to 10C, the overdrive duration may be determined or changed.

At step S170, on the basis of the determined overdrive set parameter, the operation voltage having the overdrive voltage level which greater than a target voltage level may be applied. By applying the operation voltage at step S170, the settling time of the word line voltage may be reduced.

After the overdrive operation finishes, at step S190, the operation voltage having the target voltage level decreased from the overdrive voltage level may be applied.

Figure 12A:
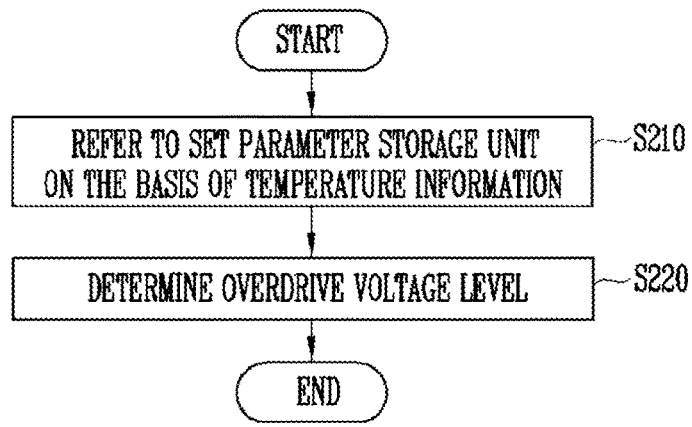
FIGS. 12A, 12B, and 12C are flowcharts illustrating examples of embodiments of an operation of determining an overdrive set parameter as illustrated in FIG. 11.
Figure 12B:
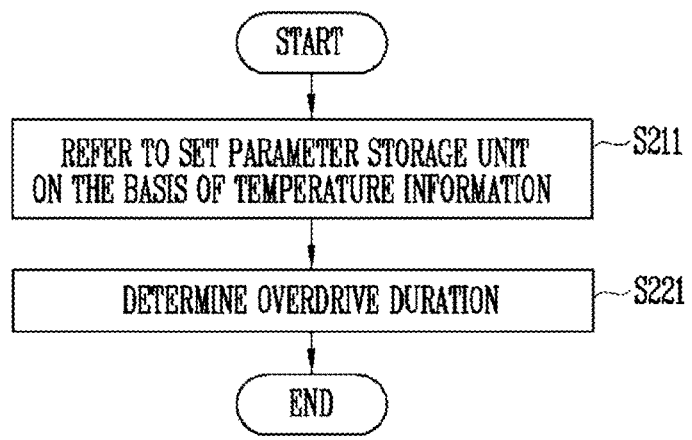
Figure 12C:
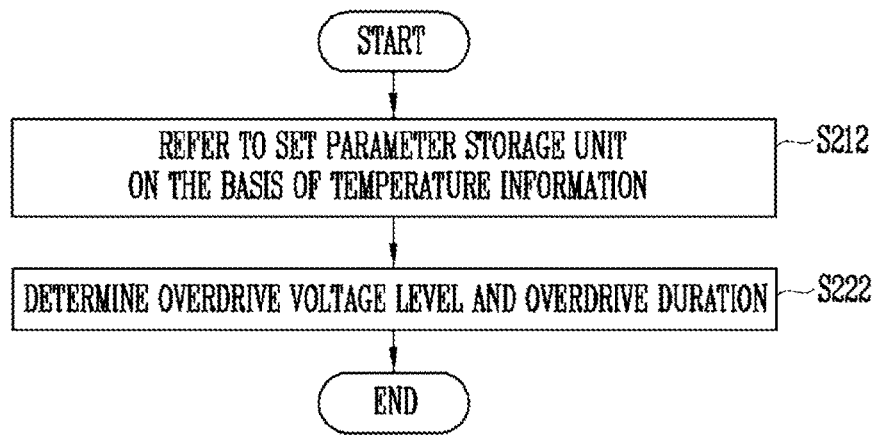

FIGS. 12A, 12B, and 12C are flowcharts illustrating examples of embodiments of the operations of determining the overdrive set parameter illustrated in FIG. 11.

Referring to FIG. 12A, determining the overdrive set parameter at step S150 may include referring to the set parameter storage unit 163 on the basis of the temperature information step S210 and determining the overdrive voltage level at step S220. Therefore, as described above with reference to FIGS. 9A to 9C, the overdrive voltage levels may be determined or changed on the basis of the current temperature of the semiconductor memory device 100.

Referring to FIG. 12B, determining the overdrive set parameter at step S150 may include referring to the set parameter storage unit 163 on the basis of the temperature information at step S211 and determining the overdrive duration at step S221. Therefore, as described above with reference to FIGS. 10A to 10C, the overdrive duration may be determined or changed on the basis of the current temperature of the semiconductor memory device 100.

Referring to FIG. 12C, determining the overdrive set parameter at step S150 may include referring to the set parameter storage unit 163 on the basis of the temperature information at step S212 and determining the overdrive voltage level and the overdrive duration at step S222. Therefore, both the overdrive voltage level and the overdrive duration may be determined or changed. Referring to FIGS. 9A to 10C, the embodiment in which the overdrive voltage level alone is determined or the overdrive duration alone is determined is illustrated. However, as illustrated in FIG. 12C, on the basis of the current temperature of the semiconductor memory device 100, both the overdrive voltage and the overdrive duration may be determined or changed.

Figure 13A:
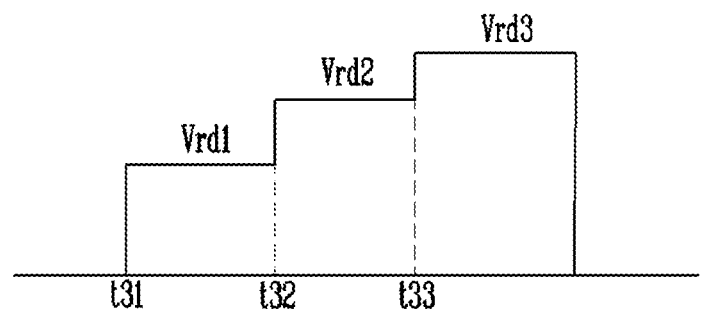
FIG. 13A is a timing diagram illustrating a read method of a general semiconductor memory device.

FIG. 13A is a timing diagram illustrating a read method of a general semiconductor memory device.

Figure 13B:
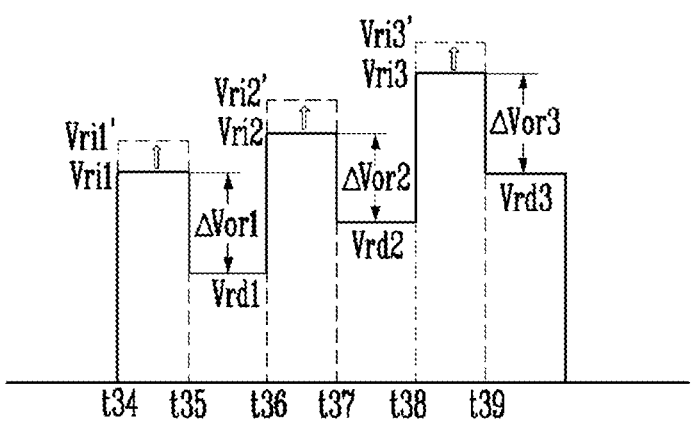
FIG. 13B is a timing diagram illustrating a read method of a semiconductor memory device according to an embodiment.

FIG. 13B is a timing diagram illustrating a read method of a semiconductor memory device according to an embodiment.

FIG. 13A illustrates a general read method where an overdrive operation is not performed. A first read voltage Vrd1 may be applied to a selected word line at a time t31. A second read voltage Vrd2 may be applied at a time t32. A third read voltage Vrd3 may be applied at a time t33. During a general read operation as described above, a read speed may be reduced since settling time increases when a read voltage is applied to the word line having a large load increases.

Referring to FIG. 13B, a read operation including an overdrive operation is illustrated. An overdrive voltage Vri1 may be applied to a selected word line at a time t34. The overdrive operation may finish at a time t35, and the first read voltage Vrd1 having the original target voltage level may be applied. The settling time of the word line may decrease as a difference ΔVor1 between the overdrive voltage Vri1 and the first read voltage Vrd1 increases.

At a time t36, an overdrive voltage Vri2 may be applied to the selected word line. The overdrive operation may finish at a time t37, and the second read voltage Vrd2 having the original target voltage level may be applied. The settling time of the word line may be reduced as a difference ΔVor2 between the overdrive voltage Vri2 and the second read voltage Vrd2 increases.

At a time t38, an overdrive voltage Vri3 may be applied to the selected word line. At a time t39, the overdrive operation may finish, and the third read voltage Vrd3 having the original target voltage level may be applied. The settling time of the word line may be reduced as a difference ΔVor3 between the overdrive voltage Vri3 and the third read voltage Vrd3 increases.

The semiconductor memory device using the overdrive operation in the program verify operation and the operating method thereof are described above with reference to FIGS. 9A to 9C. A semiconductor memory device using an overdrive operation during a read operation and an operating method thereof are described below with reference to FIG. 13B. Similarly to the descriptions made with reference to FIGS. 9A to 9C, the overdrive setting unit 160_1 of the semiconductor memory device according to an embodiment may determine the overdrive voltage levels Vri1, Vri2, and Vri3 of the voltages applied during the overdrive operation on the basis of the temperature of the semiconductor memory device 100. For example, when the temperature of the semiconductor memory device 100 is low, the settling time of the word line may increase. Therefore, to offset the above changes in the settling time, when the temperature of the semiconductor memory device 100 decreases, as indicated by dashed lines in FIG. 13B, the overdrive voltage levels Vri1, Vri2, and Vri3 may increase to overdrive voltage levels Vri1', Vri2', and Vri3', respectively.

In other words, the set parameter determination unit 165 of the overdrive setting unit 160_1 may determine higher voltage levels as the overdrive voltage levels Vri1, Vri2, and Vri3 when the temperature information generated by the temperature detection unit 161 indicates lower temperature. The set parameter determination unit 165 of the overdrive setting unit 160_1 may determine lower voltage levels as the overdrive voltage levels Vri1, Vri2, and Vri3 when the temperature information generated by the temperature detection unit 161 indicates higher temperature. Thus, even when the temperature of the semiconductor memory device 100 decreases, a short settling time for the word line voltage may be maintained by increasing the overdrive voltage levels Vri1, Vri2, and Vri3. Therefore, an operating speed may be increased during the read operation of the semiconductor memory device. On the other hand, when the temperature of the semiconductor memory device 100 increases, a desired settling time of the word line voltage may be maintained by reducing the overdrive voltage levels Vri1, Vri2, and Vri3.

FIG. 13B illustrates an embodiment in which an overdrive voltage level is changed on the basis of temperature of the semiconductor memory device 100 during a read operation. However, similarly to the descriptions made with reference to FIGS. 10A to 10C, the overdrive duration may be changed on the basis of the temperature of the semiconductor memory device 100 during the read operation.

Figure 14:
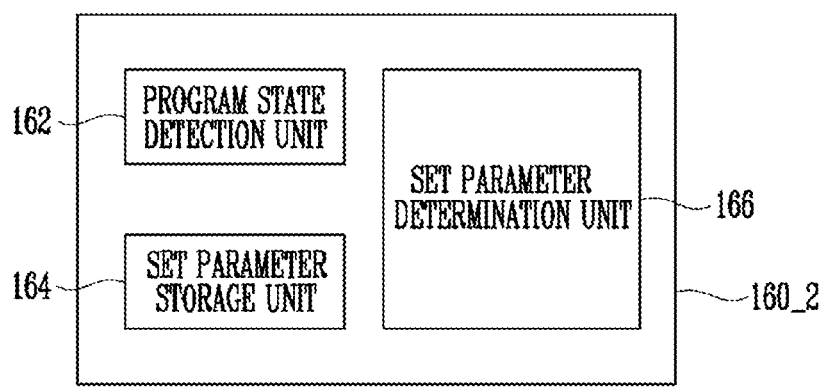
FIG. 14 is a block diagram illustrating an embodiment of an overdrive setting unit illustrated in FIG. 1.

FIG. 14 is a block diagram illustrating an embodiment (160_2) of the overdrive setting unit 160 illustrated in FIG. 1.

Referring to FIG. 14, the overdrive setting unit 160_2 may include a program state detection unit 162, a set parameter storage unit 164 and a set parameter determination unit 166.

The program state detection unit 162 may detect a program state during a program operation. For example, the program state detection unit 162 may detect whether all memory cells corresponding to a predetermined program state, among memory cells coupled to a selected word line, are completely programmed. As described above with reference to FIGS. 7A and 7B, after the memory cells corresponding to the first program state PV1 are completely programmed, the program loops PL2_1, . . . may be performed. After memory cells corresponding to the second program state PV2 are completely programmed, the program loops PL3_1, . . . may be performed. The program state detection unit 162 may detect whether memory cells corresponding to the first program state PV1 are completely programmed at each time when the program loop is completed. In addition, the program state detection unit 162 may detect whether the memory cells corresponding to the second program state PV2 are completely programmed at each time when the program loop is completed.

The set parameter storage unit 164 may store a plurality of set parameters with respect to an overdrive operation using a program verify voltage. According to an embodiment, the set parameter storage unit 164 may include information as to whether or not a program operation for a predetermined program state is completed and a look-up table including set parameters corresponding thereto. The set parameters stored in the set parameter storage unit 164 may include a voltage of an overdrive voltage level applied during the overdrive operation and an overdrive duration for which the overdrive operation is performed.

The set parameter determination unit 166 may determine one of the plurality of set parameters stored in the set parameter storage unit 164 as an overdrive set parameter of the operation voltage on the basis of the program state detected by the program state detection unit 162. The set parameter determination unit 166 may determine the overdrive set parameter corresponding to the program state information with reference to the set parameter storage unit 164 on the basis of the program state information. For example, the set parameter determination unit 166 may select one of the overdrive voltage levels stored in the set parameter storage unit 164 on the basis of the program state information. In addition, the set parameter determination unit 166 may select one of the overdrive durations stored in the set parameter storage unit 164 on the basis of the program state information.

The control logic 140 illustrated in FIG. 1 may control the address decoder 120 to apply the operation voltage having an overdrive voltage level greater than a target voltage level during an overdrive duration on the basis of the overdrive set parameter determined by the overdrive setting unit 160_2. The control logic 140 may control the address decoder 120 to apply the operation voltage having the target voltage level after performing the overdrive operation. Therefore, the operation voltage applied to the word line may decrease from the overdrive voltage level to the target voltage level.

The overdrive set parameter determined by the overdrive setting unit 160_2 and the overdrive operation performed using the determined overdrive set parameter are described below with reference to FIGS. 15 and 16.

Figure 15:
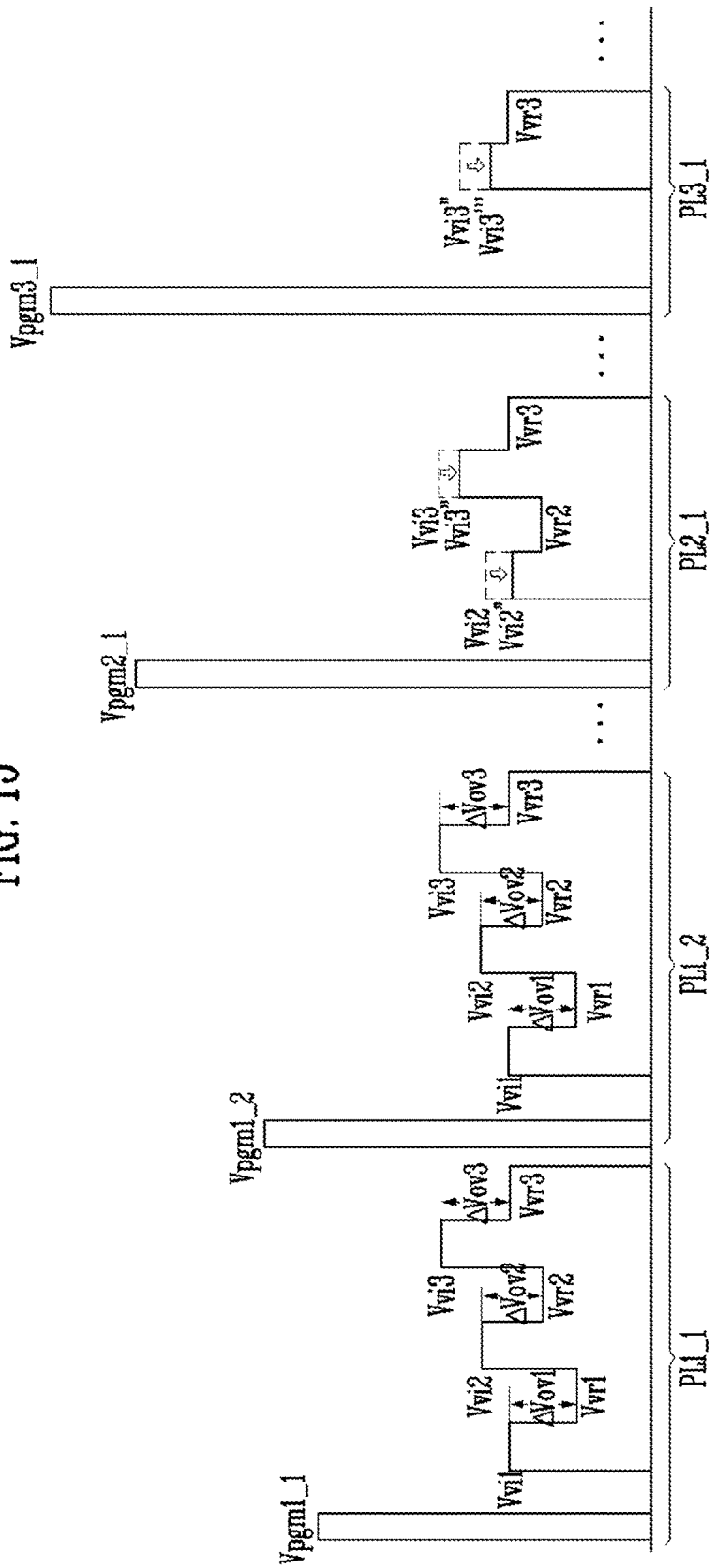
FIG. 15 is a diagram illustrating that an overdrive set level is determined by an overdrive setting unit.

FIG. 15 is a diagram illustrating that overdrive voltage levels are determined by an overdrive setting unit.

Referring to FIG. 15, in a program method of the semiconductor memory device according to an embodiment, the program loops PL1_1, PL1_2, . . . , PL2_1, . . . , and PL3_1, . . . may be performed. By the program loops PL1_1, PL1_2, . . . among the above-described program loops, memory cells corresponding to the first program state PV1 may be completely programmed. In addition, by the program loops PL2_1, . . . , memory cells corresponding to the second program state PV2 may be completely programmed. In addition, by the program loops PL3_1, . . . , memory cells corresponding to the third program state PV3 may be completely programmed Referring to FIG. 15, the program pulse Vpgm1_1 may be applied in the program loop PL1_1. After the program pulse Vpgm1_1 is applied, the program verify voltages Vvr1, Vvr2, and Vvr3 may be applied. Since the overdrive operation is performed, each of the overdrive voltage levels Vvi1, Vvi2, and Vvi3 may be applied first. After the program verify voltages Vvr1, Vvr2, and Vvr3 are applied, the program loop PL1_2 may be performed to change threshold voltages of memory cells that are not completely programmed. The program pulse Vpgm1_2 may be applied in the program loop PL1_2. Subsequently, the overdrive voltage levels Vvi1, Vvi2, and Vvi3 and the program verify voltages Vvr1, Vvr2, and Vvr3 may be applied.

After the memory cells corresponding to the first program state PV1 are completely programmed, the program loops PL2_1, . . . may be performed. The program state detection unit 162 illustrated in FIG. 14 may detect that the memory cells corresponding to the first program state PV1 are completely programmed. Therefore, the set parameter determination unit 166 may determine an overdrive set parameter in response to the completion of the program operation corresponding to the first program state PV1 with reference to the set parameter storage unit 164. For example, when the program operation corresponding to the program state PV1 is completed, as illustrated in FIG. 15, the overdrive voltage level may be reduced to control settling time. In other words, when the memory cells corresponding to the first program state PV1 are completely programmed, the overdrive voltage levels Vvi2 and Vvi3 of the program verify voltages Vvr2 and Vvr3 corresponding to the second program state PV2 and the third program state PV3 may be reduced to voltage levels Vvi2" and Vvi3", respectively. In an example, contrary to FIG. 15, the overdrive voltage level may be increased. In other words, when the memory cells corresponding to the first program state PV1 are completely programmed, the overdrive voltage levels Vvi2 and Vvi3 of the program verify voltages Vvr2 and Vvr3 corresponding to the second program state PV2 and the third program state PV3 may be increased.

After the memory cells corresponding to the second program state PV2 are completely programmed, the program loops PL3_1, . . . may be performed. Similarly, when the memory cells corresponding to the second program state PV2 are completely programmed, the overdrive voltage level Vvi3" of the program verify voltages Vvr3 corresponding to the third program state PV3 may be reduced to a voltage level Vvi3'". In addition, contrary to FIG. 15, when the memory cells corresponding to the second program state PV2 are completely programmed, the overdrive voltage level Vvi3" of the program verify voltages Vvr3 corresponding to the third program state PV3 may be increased.

Referring to FIG. 15, in the semiconductor memory device according to an embodiment, during the program operation of the memory device coupled to the selected word line, the overdrive voltage level may be changed when a program operation of memory cells corresponding to a predetermined program state is completed. Therefore, the overdrive operation may be adaptively controlled as a program is performed. As a result, an operating speed of the semiconductor memory device may be improved.

FIG. 15 illustrates an embodiment in which an overdrive voltage level for program verify is reduced when memory cells corresponding to a predetermined program state are completely programmed on the basis of program states of selected memory cells. However, though not illustrated in FIG. 15, the embodiments may also include an example in which the overdrive voltage level for program verify is increased when the memory cells corresponding to the predetermined program state are completely programmed.

Figure 16:
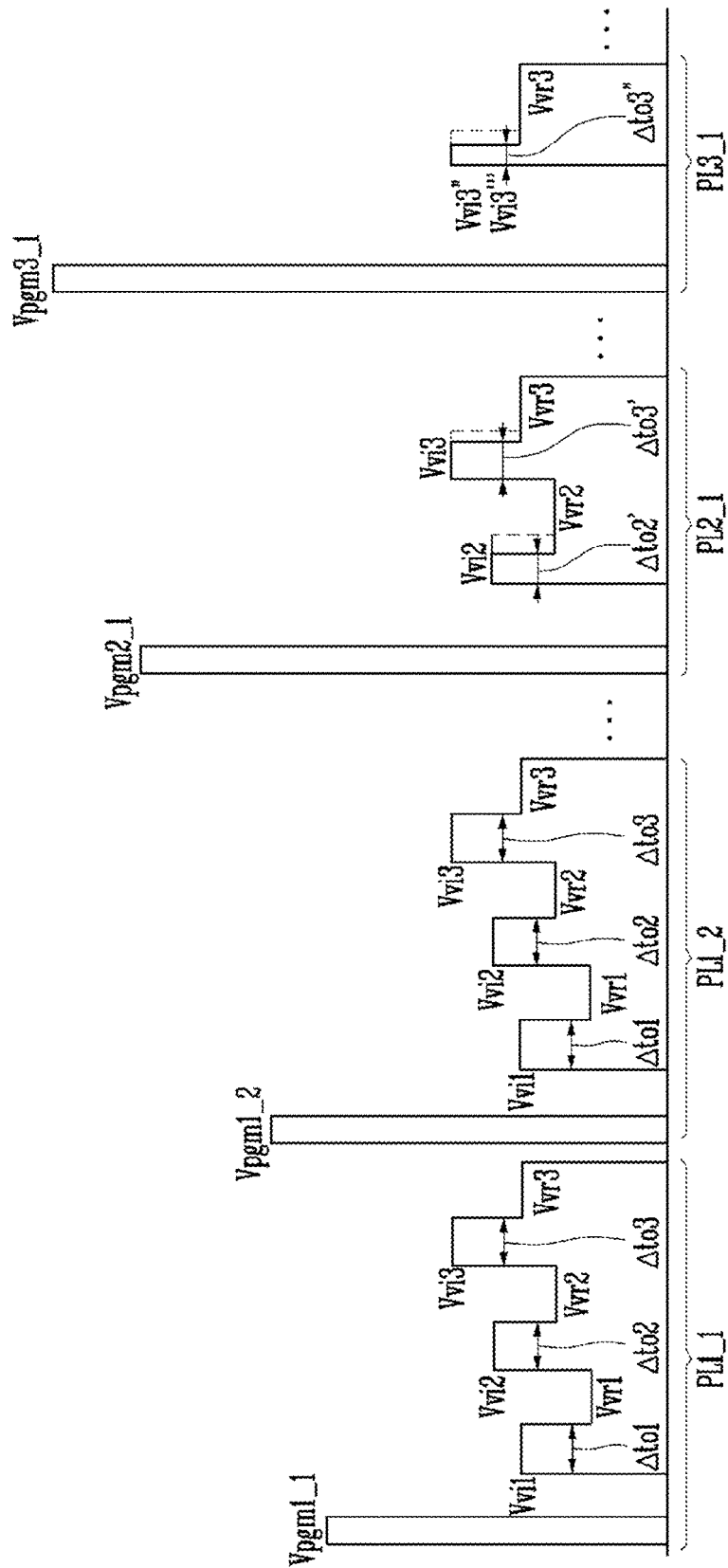
FIG. 16 is a diagram illustrating that an overdrive duration is determined by an overdrive setting unit.

FIG. 16 is a diagram illustrating that an overdrive duration is determined by an overdrive setting unit.

Referring to FIG. 16, in a program method of the semiconductor memory device according to an embodiment, the program loops PL1_1, PL1_2, . . . , PL2_1, . . . , and PL3_1, . . . may be performed. By the program loops PL1_1, PL1_2, . . . , among the above-described program loops, memory cells corresponding to the first program state PV1 may be completely programmed. In addition, by the program loops PL2_1, . . . , memory cells corresponding to the second program state PV2 may be completely programmed. In addition, memory cells corresponding to the third program state PV3 may be completely programmed by the program loops PL3_1.

Referring to FIG. 16, the program pulse Vpgm1_1 may be applied in the program loop PL1_1. After the program pulse Vpgm1_1 is applied, the program verify voltages Vvr1, Vvr2, and Vvr3 may be applied. Since the overdrive operation is performed, voltages having the overdrive voltage levels Vvi1, Vvi2, and Vvi3 may be applied first during overdrive durations Δto1, Δto2, and Δto3, respectively. After the program verify voltages Vvr1, Vvr2, and Vvr3 are applied, the program loop PL1_2 may be performed to change threshold voltages of memory cells which are not completely programmed. The program pulse Vpgm1_2 may be applied in the program loop PL1_2. Subsequently, the overdrive voltage levels Vvi1, Vvi2, and Vvi3 and the program verify voltages Vvr1, Vvr2, and Vvr3 may be applied.

After the memory cells corresponding to the first program state PV1 are completely programmed, the program loops PL2_1, . . . may be performed. The program state detection unit 162 illustrated in FIG. 14 may detect that the memory cells corresponding to the first program state PV1 are completely programmed. Therefore, the set parameter determination unit 166 may determine an overdrive set parameter in response to the completion of the program operation corresponding to the first program state PV1 with reference to the set parameter storage unit 164. For example, when the program operation corresponding to the program state PV1 is completed, as illustrated in FIG. 16, the overdrive durations may be reduced to control the settling time. In other words, when the memory cells corresponding to the first program state PV1 are completely programmed, the overdrive durations Δto2 and Δto3 of the program verify voltages Vvr2 and Vvr3 corresponding to the second program state PV2 and the third program state PV3 may be reduced to times Δto2' and Δto3', respectively. According to an embodiment, contrary to FIG. 16, when the memory cells corresponding to the first program state PV1 are completely programmed, the overdrive durations Δto2 and Δto3 of the program verify voltages Vvr2 and Vvr3 corresponding to the second program state PV2 and the third program state PV3 may be increased.

After the memory cells corresponding to the second program state PV2 are completely programmed, the program loops PL3_1, . . . may be performed. Similarly, when the memory cells corresponding to the second program state PV2 are completely programmed, the overdrive duration Δto3" of the program verify voltages Vvr3 corresponding to the third program state PV3 may be reduced to a time Δto3'". According to an embodiment, when the memory cells corresponding to the second program state PV2 are completely programmed, the overdrive duration Δto3" of the program verify voltages Vvr3 corresponding to the third program state PV3 may be increased.

As illustrated in FIG. 16, in the semiconductor memory device according to an embodiment, during the program operation of the memory device coupled to the selected word line, an overdrive duration may be changed when a program operation of memory cells corresponding to a predetermined program state is completed. Therefore, the overdrive operation may be adaptively controlled as a program is performed. Accordingly, an operating speed of the semiconductor memory device may be improved.

FIG. 16 illustrates an embodiment in which an overdrive duration for program verify is reduced when memory cells corresponding to a predetermined program state are completely programmed on the basis of program states of selected memory cells. However, though not illustrated in FIG. 16, the embodiments also include an example in which an overdrive duration for program verify is increased when memory cells corresponding to a predetermined program state are completely programmed.

Figure 17:
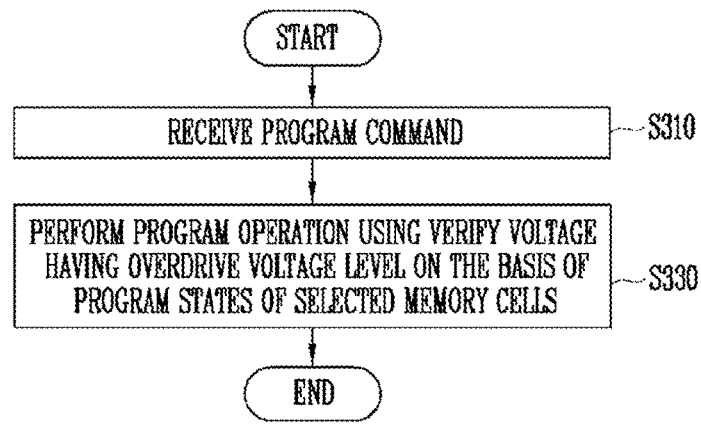
FIG. 17 is a flowchart illustrating a method of operating a semiconductor memory device according to an embodiment.

FIG. 17 is a flowchart illustrating a method of operating a semiconductor memory device according to an embodiment.

Referring to FIG. 17, a method of operating a semiconductor memory device according to an embodiment may refer to the embodiment described with reference to FIGS. 14 to 16. For example, a method of operating a semiconductor memory device according to an embodiment may include receiving a program command for a program operation of a semiconductor memory device at step S310 and performing a program operation using a program verify voltage having an overdrive voltage level on the basis of program states of selected memory cells at step S330. An embodiment of step S330 at which the program operation using the program verify voltage having the overdrive voltage level is performed on the basis of program states of selected memory cells is described below with reference to FIG. 18.

Figure 18:
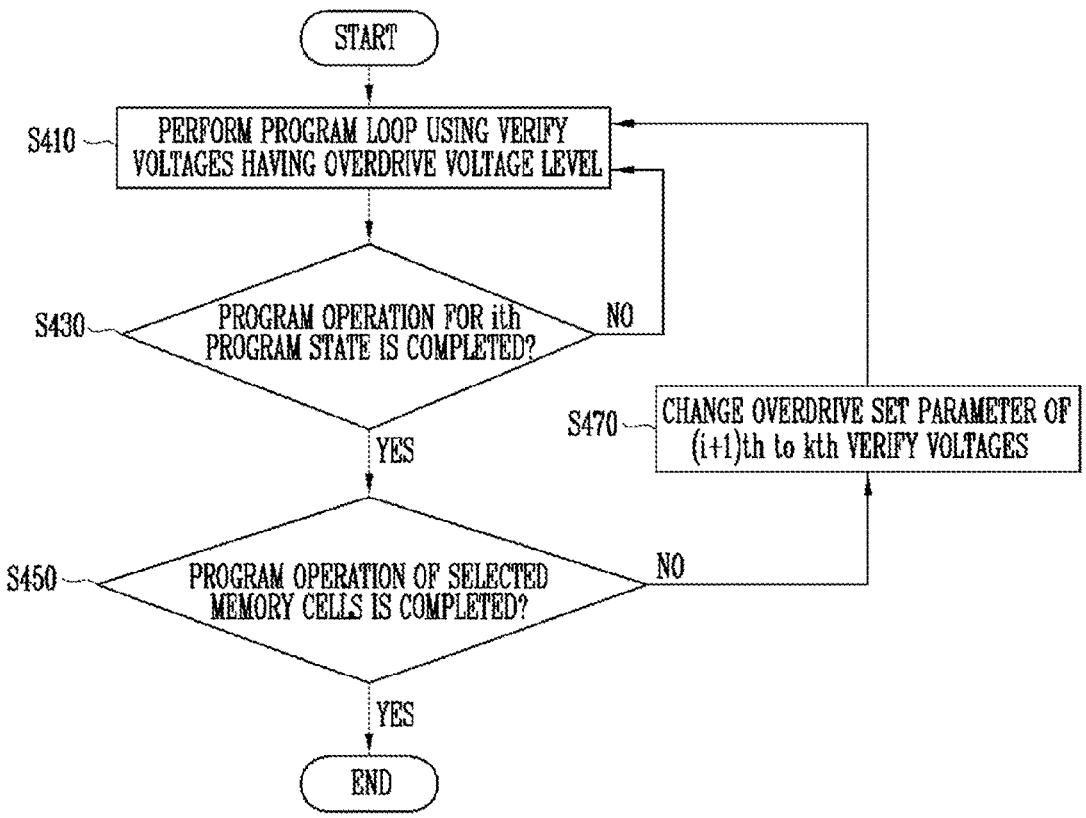
FIG. 18 is a flowchart of a program operation using a verify voltage having an overdrive voltage level as illustrated in FIG. 17.

FIG. 18 is a flowchart illustrating a program operation using the verify voltage having the overdrive voltage level as illustrated in FIG. 17.

Referring to FIG. 18, to perform a program operation using a program verify voltage having an overdrive voltage level, a program loop may be performed using verify voltages having an overdrive voltage level at step S410. For example, one of the program loops PL1_1, PL1_2, . . . as illustrated in FIGS. 15 and 16 may be performed at step S410.

Subsequently, it may be determined whether a program operation for an ith program state is completed at step S430. For example, at step S430, it may be determined whether a program operation for the first program state PV1 is completed. When the program operation for the first program state PV1 is not completed, the process flow proceeds to step S410 to repeat the program loop.

When the program operation for the ith program state is completed, it may be determined whether the program operation on all selected memory cells is completed at step S450. When the program operation of all selected memory cells is completed, the program operation may finish. On the other hand, when the program operation of all selected memory cells is not completed, an overdrive set parameter of (i+1)th to kth program verify voltages may be changed at step S470, where k may be a natural number of 2 or greater and i may be a natural number greater than 1 and less than k. For example, when memory cells included in the memory cell array 110 are MLCs, k may be 3 and i may be 1 or 2. In an example, when the memory cells included in the memory cell array 110 are TLCs, k may be 7 and i may be one of 1 to 6. In an example, when memory cells included in the memory cell array 110 are QLCs, k may be 15 and i may be one of 1 to 14.

For example, when the program operation for the first program state PV1 is completed, an overdrive voltage level may be changed as illustrated in FIG. 15, or an overdrive duration may be changed as illustrated in FIG. 16.

As illustrated in FIGS. 17 and 18, in a program method of the semiconductor memory device according to an embodiment, an overdrive operation may be adaptively controlled as a program operation is performed. As a result, an operating speed of the semiconductor memory device may be improved.

Figure 19:
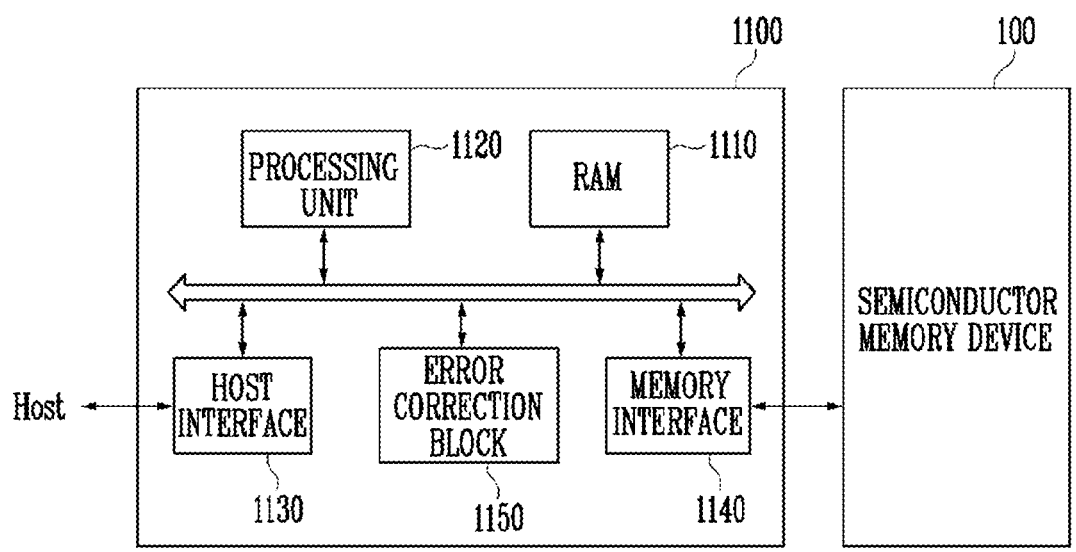
FIG. 19 is a block diagram illustrating a memory system including a semiconductor memory device illustrated in FIG. 1.

FIG. 19 is a block diagram illustrating a memory system 1000 including the semiconductor memory device 100 illustrated in FIG. 1. In an embodiment, for example, a semiconductor device may include a memory system 1000.

Referring to FIG. 19, the memory system 1000 according to the embodiments may include the semiconductor memory device 100 and a controller 1100. Since the semiconductor memory device 100 may be the same as the semiconductor memory devices described above with reference to FIG. 1, a description thereof will be omitted.

The controller 1100 may be coupled to a host and the semiconductor memory device 100 and access the semiconductor memory device 100 in response to a request from the host. For example, the controller 1100 may control read, write, erase and background operations of the semiconductor memory device 100. The controller 1100 may be configured to provide an interface between the semiconductor memory device 100 and the host. The controller 1100 may be configured to drive firmware for controlling the semiconductor memory device 100.

The controller 1100 may include a random access memory (RAM) 1110, a processing unit 1120, a host interface 1130, a memory interface 1140 and an error correction block 1150. The RAM 1110 may serve as an operation memory of the processing unit 1120, a cache memory between the semiconductor memory device 100 and the host, and a buffer memory between the semiconductor memory device 100 and the host. In addition, the controller 1100 may temporarily store program data provided from the host during a read operation.

The host interface 1130 may interface with the host to perform data exchange between the host and the controller 1100. For example, the controller 1100 may communicate with the host through various interface protocols including a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, a private protocol, or a combination thereof.

The memory interface 1140 may interface with the semiconductor memory device 100. For example, the memory interface 1140 may include a NAND interface or a NOR interface.

The error correction block 1150 may detect and correct errors in data read from the semiconductor memory device 100 by using an error correction code (ECC). The processing unit 1120 may control a read voltage based on an error detection result of the error correction block 1150 and perform a re-read operation. According to an embodiment, the error correction block may be provided as a component of the controller 1100.

The controller 1100 and the semiconductor memory device 100 may be integrated in a single semiconductor device. According to an embodiment, the controller 1100 and the semiconductor memory device 100 may be integrated in a single semiconductor device to form a memory card such as a PC card (personal computer memory card international association (PCMCIA)), a compact flash card (CF), a smart media card (SMC), a memory stick, a multimedia card (MMC, RS-MMC or MMCmicro), an SD card (SD, miniSD, micro SD or SDHC), a universal flash storage device (UFS), etc.

The controller 1100 and the semiconductor memory device 100 may be integrated in a single semiconductor device to form a solid state drive (SSD). The SSD may include a storage device for storing data in a semiconductor memory device. When the memory system 1000 is used as an SSD, operational rates of the host coupled to the memory system 1000 may be significantly improved.

In an example, the memory system 1000 may be used as one of several elements in various electronic devices such as a computer, an ultra mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, etc.

According to an example of an embodiment, the semiconductor memory device 100 or the memory system 1000 may be packaged in various forms. For example, the semiconductor memory device 100 or the memory system 1000 may be packaged by various methods such as a package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual in line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi chip package (MCP), a wafer-level fabricated package (WFP), a wafer-level processed stack package (WSP), etc.

Figure 20:
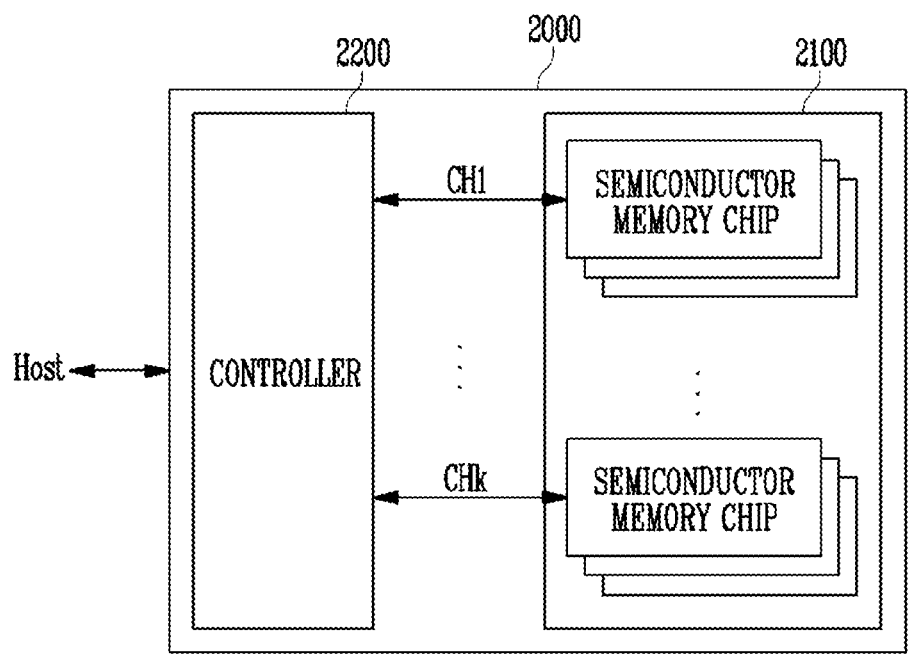
FIG. 20 is a block diagram illustrating an application example of a memory system illustrated in FIG. 19.

FIG. 20 is a block diagram illustrating an application example (2000) of the memory system 1000 illustrated in FIG. 19.

Referring to FIG. 20, a memory system 2000 may include a semiconductor memory device 2100 and a controller 2200. The semiconductor memory device 2100 may include a plurality of semiconductor memory chips. The plurality of semiconductor memory chips may be divided into groups. In an embodiment, for example, a semiconductor device may include a memory system 2000.

FIG. 20 illustrates the plurality of groups communicating with the controller 2200 through first to k-th channels CH1 to CHk. Each of the semiconductor memory chips may be configured and operated in substantially the same manner as one of the semiconductor memory devices 100 described above with reference to FIG. 1.

Each group may communicate with the controller 2200 through a single common channel. The controller 2200 may be configured in substantially the same manner as the controller 1100 described with reference to FIG. 19, and configured to control the plurality of memory chips of the semiconductor memory device 2100 through the plurality of first to k-th channels CH1 to CHk.

Figure 21:
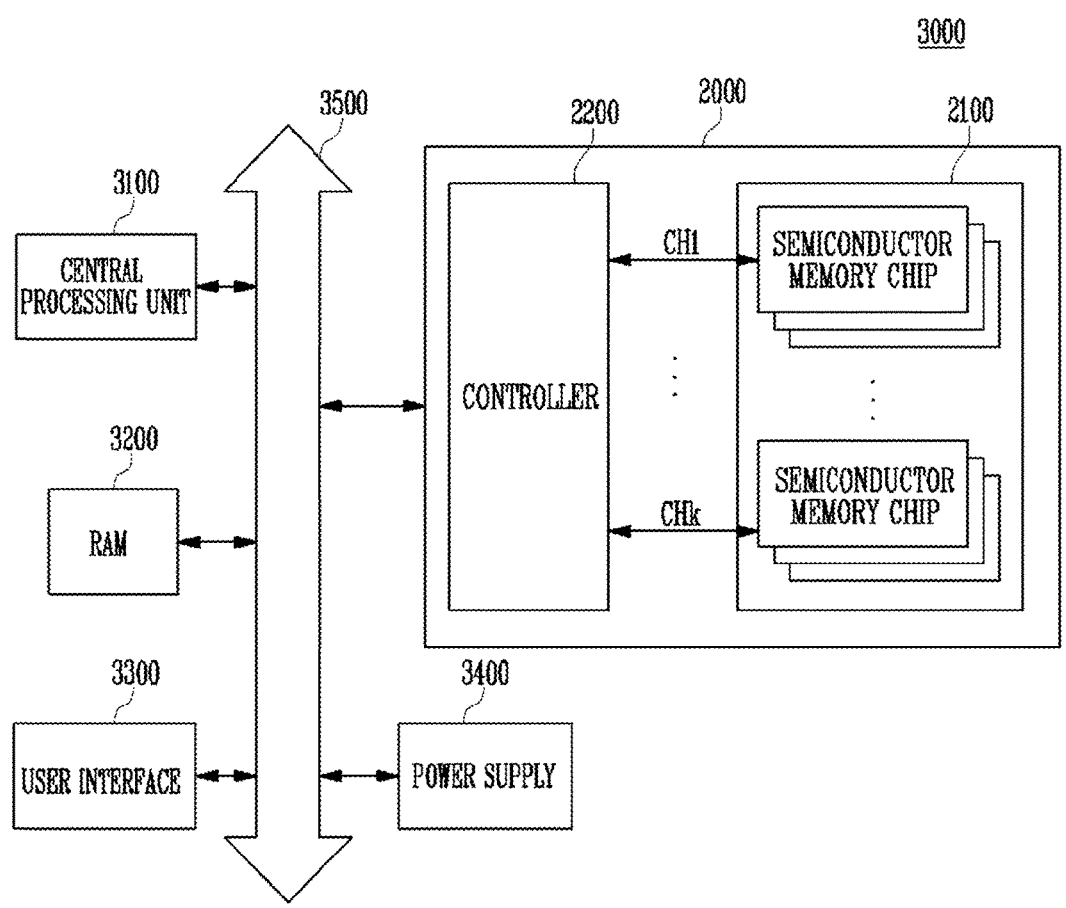
FIG. 21 is a block diagram illustrating a computing system including a memory system described with reference to FIG. 20.

FIG. 21 is a block diagram illustrating a computing system 3000 having the memory system described above with reference to FIG. 20. In an embodiment, for example, a semiconductor device may include a computing system 3000.

The computing system 3000 may include a central processing unit 3100, a random access memory (RAM) 3200, a user interface 3300, a power supply 3400, a system bus 3500, and the memory system 2000.

The memory system 2000 may be electrically connected to the central processing unit 3100, the RAM 3200, the user interface 3300 and the power supply 3400 through the system bus 3500. Data provided trough the user interface 3300 or processed by the central processing unit 3100 may be stored in the memory system 2000.

Referring to FIG. 21, the semiconductor memory device 2100 may be coupled to the system bus 3500 through the controller 2200. However, the semiconductor memory device 2100 may be directly coupled to the system bus 3500. The central processing unit 3100 and the RAM 3200 may perform the functions of the controller 2200.

Referring to FIG. 21, the memory system 2000 illustrated in FIG. 20 may be provided. However, the memory system 2000 may be replaced with the memory system 1000 described above with reference to FIG. 19. According to an embodiment, the computing system 3000 may include both of the memory systems 1000 and 2000 described above with reference to FIGS. 19 and 20, respectively.

According to an embodiment, a semiconductor memory device having improved operating characteristics may be provided.

According to an embodiment, a method of operating a semiconductor memory device having improved operating characteristics may be provided.

The present description may provide a new operating method and circuits for implementing the same in line with a changed structure of a memory array to increase the degree of integration, thereby increasing operating characteristics and reliability.

What is claimed is:

1. A semiconductor memory device, comprising:
a memory cell array including a plurality of cell strings;
an address decoder coupled to the memory cell array through word lines and configured for decoding an address for an operation on the memory cell array;
a read and write circuit configured for performing a read operation or a program operation on the memory cell array;
a control logic configured for controlling the address decoder and the read and write circuit to perform the read operation or the program operation on the memory cell array; and
an overdrive setting unit configured for determining an overdrive set parameter of an overdrive operation using an operation voltage applied to the word lines of the memory cell array,
wherein the control logic controls the overdrive operation using the operation voltage applied to the word lines on the basis of the overdrive set parameter, and
wherein the control logic controls the address decoder to apply the operation voltage having an overdrive voltage level greater than a target voltage level on the basis of the overdrive set parameter during an overdrive duration and to apply the operation voltage having the target voltage level after the overdrive duration.

2. The semiconductor memory device of claim 1, wherein the overdrive setting unit comprises:
a temperature detection unit configured for detecting a temperature of the semiconductor memory device to generate temperature information;
a set parameter storage unit configured for storing a plurality of set parameters on the overdrive operation using the operation voltage; and
a set parameter determination unit configured for determining one of the plurality of set parameters stored in the set parameter storage unit as the overdrive set parameter of the operation voltage on the basis of the temperature information.

3. The semiconductor memory device of claim 2, wherein the set parameter determination unit determines the overdrive voltage level of the operation voltage applied during the overdrive operation on the basis of the temperature information.

4. The semiconductor memory device of claim 3, wherein the set parameter determination unit determines a voltage value having a lower level as the overdrive voltage level when the temperature information indicates higher temperature.

5. The semiconductor memory device of claim 2, wherein the set parameter determination unit determines the overdrive duration for which the overdrive operation is performed on the basis of the temperature information.

6. The semiconductor memory device of claim 5, wherein the set parameter determination unit determines a shorter time as the overdrive duration when the temperature information indicates higher temperature.

7. The semiconductor memory device of claim 2, wherein the operation voltage includes at least one of a program verify voltage applied to the word lines during the program operation and a read voltage applied to the word lines during the read operation.

8. The semiconductor memory device of claim 1, wherein the operation voltage is a program verify voltage applied to the word lines during the program operation, and
the overdrive setting unit comprises:
a program state detection unit configured for detecting a program state during the program operation;
a set parameter storage unit configured for storing a plurality of set parameters for the overdrive operation using the program verify voltage; and
a set parameter determination unit configured for determining one of the plurality of set parameters stored in the set parameter storage unit as the overdrive set parameter of the operation voltage on the basis of detected program state information.

9. The semiconductor memory device of claim 8, wherein memory cells of the memory cell array are programmed to have one of an erase state and first to kth program states by the program operation of a selected word line, and
the set parameter determination unit changes an overdrive set parameter of a program verify voltage for each of (i+1)th to kth program states when a program operation for an ith program state, among the first to kth program states, is completed,
where k is a natural number of 2 or more and i is a natural number of 1 or more and less than k.

10. The semiconductor memory device of claim 9, wherein the overdrive set parameter includes the overdrive voltage level of the operation voltage applied during the overdrive operation, and
the set parameter determination unit reduces the overdrive voltage level of the program verify voltage for each of the (i+1)th to kth program states when the program operation for the ith program state, among the first to kth program states, is completed.

11. The semiconductor memory device of claim 9, wherein the overdrive set parameter includes the overdrive voltage level of the operation voltage applied during the overdrive operation, and
the set parameter determination unit increases the overdrive voltage level of the program verify voltage for each of the (i+1)th to kth program states when the program operation for the ith program state, among the first to kth program states, is completed.

12. The semiconductor memory device of claim 9, wherein the overdrive set parameter includes the overdrive duration for which the overdrive operation is performed, and the set parameter determination unit reduces the overdrive duration for which the overdrive operation using the program verify voltage for each of the (i+1)th to kth program states is performed when the program operation for the ith program state, among the first to kth program states, is completed.

13. The semiconductor memory device of claim 9, wherein the overdrive set parameter includes the overdrive duration for which the overdrive operation is performed, and the set parameter determination unit increases the overdrive duration for which the overdrive operation using the program verify voltage for each of the (i+1)th to kth program states is performed when the program operation for the ith program state, among the first to kth program states, is completed.

14. A method of operating a semiconductor memory device, the method comprising:
receiving an operation command for an operation of the semiconductor memory device;
detecting, by a temperature detection unit, a current temperature of the semiconductor memory device to generate temperature information;
determining, by a set parameter determination unit, an overdrive set parameter of an operation voltage related to the operation command on the basis of the temperature information, the operation voltage being to be applied to a word line of the semiconductor memory device;
applying, by a control logic, an operation voltage having an overdrive voltage level greater than a target voltage level on the basis of the overdrive set parameter to the word line; and
applying, by the control logic, the operation voltage having the target voltage level by reducing the overdrive voltage level to the word line.

15. The method of claim 14, wherein the overdrive set parameter includes a voltage value determined by the overdrive voltage level, and
by the set parameter determination unit, the voltage value having a lower level is determined as the overdrive voltage level when the temperature information indicates higher temperature.

16. The method of claim 14, wherein the overdrive set parameter includes an overdrive duration for which the overdrive operation is performed, and
by the set parameter determination unit, a shorter time is determined as the overdrive duration for which the temperature information indicates higher temperature.

17. A method of operating a semiconductor memory device, the method comprising:
receiving a program command for a program operation of the semiconductor memory device; and
performing, by a peripheral circuit and an overdriving setting unit, a program operation using a program verify voltage having an overdrive voltage level on the basis of program states of selected memory cells,
wherein memory cells of the semiconductor memory device are programmed to have one of an erase state and first to kth program states by the program operation, and
the performing of the program operation using the program verify voltage having the overdrive voltage level comprises:
performing, by the peripheral circuit, a program loop for an ith program state, among the first to kth program states, by using verify voltages having the overdrive voltage level;
determining, by a program state detection unit of the overdriving setting unit, whether a program operation for the ith program state is completed; and
changing, by a set parameter detection unit of the overdriving setting unit, an overdrive set parameter of a program verify voltage for each of (i+1)th to kth program states when the program operation for the ith program state is completed,
where k is a natural number of 2 or more and i is a natural number of 1 or more and less than k.

18. The method of claim 17, further comprising performing, by the peripheral circuit, a program loop for the (i+1)th program state after changing the overdrive set parameter of the program verify voltage for each of the (i+1)th to kth program states after the program operation for the ith program state is completed.

* * * * *